(12) United States Patent
Wang

(10) Patent No.: US 11,533,039 B2
(45) Date of Patent: Dec. 20, 2022

(54) LITHIUM NIOBATE OR LITHIUM TANTALATE FBAR STRUCTURE AND FABRICATING METHOD THEREOF

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/649,461

(22) Filed: Jan. 31, 2022

(65) Prior Publication Data

US 2022/0158613 A1    May 19, 2022

Related U.S. Application Data

(63) Continuation of application No. 17/535,834, filed on Nov. 26, 2021.

(51) Int. Cl.
| | | |
|---|---|---|
| *H03H 9/17* | (2006.01) | |
| *H03H 9/13* | (2006.01) | |
| *H03H 3/02* | (2006.01) | |
| *H03H 9/02* | (2006.01) | |

(52) U.S. Cl.
CPC .............. *H03H 9/132* (2013.01); *H03H 3/02* (2013.01); *H03H 9/02031* (2013.01); *H03H 9/173* (2013.01); *H03H 9/176* (2013.01); *H03H 2003/021* (2013.01)

(58) Field of Classification Search
CPC .... H03H 9/132; H03H 9/02031; H03H 9/173; H03H 9/176
See application file for complete search history.

(56) References Cited

U.S. PATENT DOCUMENTS

| 10,153,750 B2 | 12/2018 | Hurwitz | |
|---|---|---|---|
| 11,063,571 B2 | 7/2021 | Hurwitz | |
| 2007/0001544 A1* | 1/2007 | Geefay | H03H 3/02 |
| | | | 310/311 |
| 2017/0338799 A1* | 11/2017 | Ruby | H03H 9/171 |

(Continued)

FOREIGN PATENT DOCUMENTS

| CN | 108173525 A | 6/2018 |
|---|---|---|
| CN | 111130484 A | 5/2020 |

(Continued)

OTHER PUBLICATIONS

Lithium Niobate Asymmetrical Mode Piezoelectrc MEMS Resonator, Songbin Gong.*

*Primary Examiner* — Bryan P Gordon
(74) *Attorney, Agent, or Firm* — Finnegan, Henderson, Farabow, Garrett & Dunner, LLP

(57) ABSTRACT

A film bulk acoustic resonator (FBAR) structure includes, a bottom cap wafer, a piezoelectric layer disposed on the bottom cap wafer, the piezoelectric layer including lithium niobate or lithium tantalate, a bottom electrode disposed below the piezoelectric layer, and a top electrode disposed above the piezoelectric layer. Portions of the bottom electrode, the piezoelectric layer, and the top electrode that overlap with each other constitute a piezoelectric stack. The FBAR structure also includes a cavity disposed below the piezoelectric stack. A projection of the piezoelectric stack is located within the cavity.

19 Claims, 29 Drawing Sheets

(56) References Cited

U.S. PATENT DOCUMENTS

| | | | |
|---|---|---|---|
| 2020/0091888 A1* | 3/2020 | Lee | H03H 9/173 |
| 2020/0176666 A1* | 6/2020 | Lee | H03H 9/13 |
| 2020/0212884 A1* | 7/2020 | Shin | H03H 9/173 |
| 2021/0218381 A1 | 7/2021 | Luo | |
| 2021/0281237 A1 | 9/2021 | Hsu | |

FOREIGN PATENT DOCUMENTS

| | | |
|---|---|---|
| CN | 111865248 A | 10/2020 |
| CN | 113162568 A | 7/2021 |

\* cited by examiner

LITHIUM NIOBATE OR LITHIUM TANTALATE FBAR STRUCTURE AND FABRICATING METHOD THEREOF

CROSS-REFERENCE TO RELATED APPLICATION

This application is a continuation application of U.S. application Ser. No. 17/535,834 filed on Nov. 26, 2021, the content of which is hereby incorporated by reference in its entirety.

FIELD OF THE DISCLOSURE

The present disclosure relates to the field of semiconductor devices and, in particular, to a lithium niobate (LN) or lithium tantalate (LT) film bulk acoustic resonator (FBAR) structure and a method of fabricating the FBAR structure.

BACKGROUND

Lithium niobate ($LiNbO_3$, also referred to as "LN") and lithium tantalate ($LiTaO_3$, also referred to as "LT") piezoelectric crystal materials have been used in the large-scale industrial manufacturing of surface acoustic wave (SAW) filters. But generally, the LN and LT piezoelectric crystal materials have not been used in the large-scale manufacturing of bulk acoustic wave (BAW) filters, such as a filter having a film bulk acoustic resonator (FBAR) structure. The main reasons are as follows.

First, high-quality LT and LN crystals are made from ingots obtained by a molten crystal pulling method. It may not be possible to obtain an LT or LN piezoelectric material layer by using physical vapor deposition (PVD) or chemical vapor deposition (CVD) processes which are conventionally used in FBAR/BAW filter manufacturing process.

Even though the industry already has a relatively mature technique for forming a raw wafer including a stacking of Si substrate/$SiO_2$ layer/LN layer through a bonding process, the industry still lacks a manufacturing method for LN or LT FBAR structure suitable for mass production, especially because it is difficult to form a bottom electrode of the LN or LT FBAR structure. In the raw wafer consisting of Si substrate/$SiO_2$ layer/LN layer, the LN layer is directly formed on the $SiO_2$ layer, and there may be no metal layer between the LN film layer and the SiO2 layer to form a bottom electrode. Therefore, there is a need for a large-scale commercial mass production solution.

SUMMARY

According to an embodiment of the present disclosure, a film bulk acoustic resonator (FBAR) structure is provided. The FBAR structure includes a bottom cap wafer, a piezoelectric layer disposed on the bottom cap wafer, the piezoelectric layer including lithium niobate or lithium tantalate, a bottom electrode disposed below the piezoelectric layer, and a top electrode disposed above the piezoelectric layer. Portions of the bottom electrode, the piezoelectric layer, and the top electrode that overlap with each other constitute a piezoelectric stack. The FBAR structure also includes a cavity disposed below the piezoelectric stack. A projection of the piezoelectric stack is located within the cavity.

According to an embodiment of the present disclosure, a method for fabricating a film bulk acoustic resonator (FBAR) structure is provided. The method includes: obtaining a wafer, at least a portion of the wafer is made of a piezoelectric material; forming a bottom electrode layer on the wafer; patterning the bottom electrode layer to form a bottom electrode; forming a sacrificial island on the bottom electrode; bonding a bottom cap wafer onto the bottom electrode; processing the wafer to form a piezoelectric layer; forming a top electrode layer on the piezoelectric layer; patterning the top electrode layer to form a top electrode; and removing the sacrificial island to form a cavity.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1:
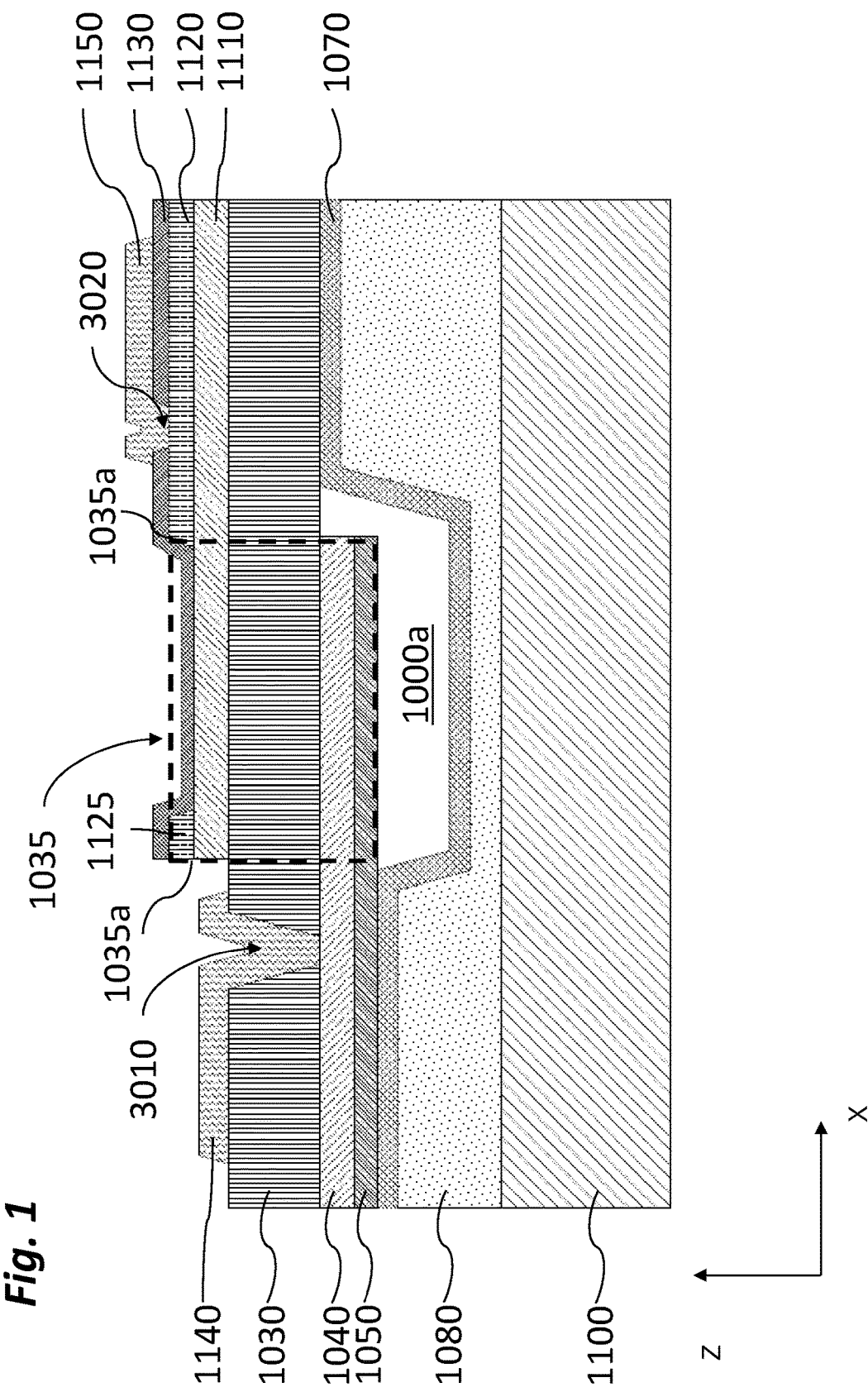
FIG. 1 is a cross-sectional view of a film bulk acoustic resonator (FBAR) structure, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "front," "back," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

In terms of piezoelectric performance, lithium niobate (LN) and lithium tantalate (LT) piezoelectric materials have advantages over aluminum nitride (AlN) piezoelectric material used in bulk acoustic wave filters. Compared with AlN piezoelectric materials, LN and LT piezoelectric materials have higher electromechanical coupling coefficient (K2t) characteristics. Using LN or LT piezoelectric materials in a FBAR filter can make the FBAR filter have a higher bandwidth. Another advantage of LN and LT piezoelectric materials is that LN and LT piezoelectric materials have a much higher dielectric constant than AlN materials, which can significantly reduce the area of a resonator and a filter chip made of the LN or LT piezoelectric material, lowing unit manufacturing cost. For example, the relative dielectric constant of AlN is about 9.8, while that of LN is higher than 50. Therefore, for a resonator with the same impedance, the area of the resonator made of LN material is one-fifth of that of the resonator made of AlN material. For the resonator operating near 800 MHz, when a 2-μm-thick AlN layer is used as the piezoelectric material layer, the area of a 50 ohm resonator is 91700 $\mu m^2$, and when a 2-μm-thick LN layer is used as the piezoelectric material layer, the area of a 50 ohm resonator is only 18000 $\mu m^2$, which is about one-fifth of the area of the AlN resonator.

FIG. 1 is a cross-sectional view of a film bulk acoustic resonator (FBAR) structure 1000, according to an embodiment of the present disclosure. As illustrated in FIG. 1, FBAR structure 1000 includes a bottom cap wafer 1100, a piezoelectric layer 1030 disposed on bottom cap wafer 1100, a bottom electrode 1040 disposed below piezoelectric layer 1030, and a top electrode 1110 disposed above piezoelectric layer 1030. Portions of bottom electrode 1040, piezoelectric layer 1030, and top electrode 1110 that overlap with each other constitute a piezoelectric stack 1035. FBAR structure 1000 also includes a cavity 1000a disposed below piezoelectric stack 1035. Cavity 1000a provides a reflection layer for an acoustic wave at a solid-gas interface required for the operation of the FBAR resonator.

A projection of the piezoelectric stack 1035 along a stacking direction of piezoelectric stack 1035 (Z-axis direction in FIG. 1) is located within cavity 1000a. In other words, in a top view of FBAR structure 1000 (viewing along the Z-axis direction), edges 1035a of piezoelectric stack 1035 are located inside cavity 1000a. In the present embodiment, both of top electrode 1110 and bottom electrode 1040 are formed through precise pattern etching to obtain required structures. As a result, the vertical overlap of top and bottom electrodes 1110 and 1040 in a non-effective resonator function area (i.e., an area outside of cavity 1000a) is minimized, and thus the parasitic capacitance is minimized.

Bottom cap wafer 1100 may include a material such as, for example, silicon (Si), glass ($SiO_2$), or sapphire ($Al_2O_3$). In the present embodiment, bottom cap wafer 1100 includes silicon.

Piezoelectric layer 1030 may include a material with piezoelectric properties such as lithium niobate (LN) or lithium tantalate (LT).

Top and bottom electrodes 1110 and 1040 may include any suitable conductive material, including various metal materials with conductive properties such as molybdenum (Mo), aluminum (Al), copper (Cu), platinum (Pt), tantalum (Ta), tungsten (W), palladium (Pd), ruthenium (Ru), etc., or a stacked combination of two or more of those conductive metal materials. In the present embodiment, top and bottom electrodes 1110 and 1040 include molybdenum (Mo).

As illustrated in FIG. 1, a frame layer 1120 is disposed on at least a portion of an upper surface of top electrode 1110. Frame layer 1120 includes a raised structure 1125 along an edge of a resonator electrode (i.e., top electrode 1110 in the present embodiment). Raised structure 1125 protrudes upwards, away from cavity 1000a. Frame layer 1120 may include a conductive material, which may be the same as the material of top electrode 1110 or may be different from the material of top electrode 1110. Additionally or alternatively, in an embodiment, frame layer 1120 may be disposed on at least a portion of a lower surface of bottom electrode 1040, to form a raised structure along an edge of bottom electrode 1040 that protrudes from bottom electrode 1040 in a direction towards cavity 1000a.

A top passivation layer 1130 is disposed above, and covers top surfaces of, top electrode 1110 and frame layer 1120. A bottom passivation layer 1050 is disposed below, and covers the lower surface of, bottom electrode 1040. Bottom passivation layer 1050 may include an electrically insulating material such as silicon nitride (SiN) or aluminum nitride (AlN). Top passivation layer 1130 may include an electrically insulating material such as silicon nitride (SiN), aluminum nitride (AlN), silicon oxide ($SiO_2$), silicon oxynitride (SiNO), etc., or a stacked combination of two or more of those materials.

The cavity 1000a is obtained by removing a sacrificial island (not illustrated in FIG. 1). The sacrificial island may include silicon oxide. A boundary of the removal of the sacrificial island is defined by a boundary layer 1070 (also referred-to as an "etch stop layer"), which surrounds the sacrificial island before the sacrificial island is removed. Boundary layer 1070 may include non-conductive materials such as silicon (Si), silicon nitride (SiN), aluminum nitride (AlN), polysilicon, or amorphous silicon, or a stacked combination of two or more of those materials. The process of forming cavity 1000a will be explained in more detail below.

A bonding layer 1080 is disposed below boundary layer 1070, and bonded to bottom cap wafer 1100. Bonding layer 1080 may include silicon oxide, silicon nitride, ethyl silicate, etc., or a stacked combination of those materials. In the present embodiment, bottom bonding layer 1080 includes silicon oxide.

Top passivation layer 1130 is provided with a top electrode contact window 3020 that exposes a portion of frame layer 1120, which is electrically connected to top electrode 1110. A top electrode contact layer 1150 is disposed above top passivation layer 1130 and is electrically connected to top electrode 1110, via top electrode contact window 3020 and frame layer 1120. Top electrode contact layer 1150 includes leads and pads for top electrode 1110. Piezoelectric layer 1030 is provided with a bottom electrode contact window 3010 that exposes a portion of bottom electrode 1040. A bottom electrode contact layer 1140 is disposed above piezoelectric layer 1030 and is electrically connected to bottom electrode 1040 via bottom electrode contact window 3010. Bottom electrode contact layer 1140 includes leads and pads for bottom electrode 1040. Top electrode contact layer 1150 and bottom electrode contact layer 1140 may include various metals, such as aluminum (Al), copper (Cu), gold (Au), titanium (Ti), tungsten (W), platinum (Pt), etc., or a stacked combination of two or more of those metals.

When piezoelectric layer 1030 includes LN or LT, FBAR structure 1000 may also be referred to as an LN or LT FBAR structure. The LN or LT FBAR structure may be fabricated according to one of the following two process schemes. The first process scheme uses a composite substrate, which may be commercially available silicon substrate/silicon oxide/LN piezoelectric film. The bottom electrode is deposited on the composite substrate and is patterned. Then, the FBAR structure is formed. Afterwards, the completed structure is bonded with another substrate bond, and the original silicon substrate and the silicon oxide layer in the composite substrate are removed. Then, the top electrode is deposited and patterned, and circuit connections are formed. The cavity of the FBAR resonator is formed by removing the sacrificial island defined by the boundary layer.

The second process scheme uses an LN or LT single crystal substrate directly. The bottom electrode is deposited on the LN or LT substrate, and is patterned. Then, the FBAR structure is formed. Afterwards, the completed structure is bonded with another substrate. The original LN or LT substrate is thinned to the required thickness for the piezoelectric layer. Then, the top electrode is deposited and patterned. Finally, circuit connections are formed. The cavity of the FBAR resonator is formed by removing the sacrificial island defined by the boundary layer.

Figure 2:
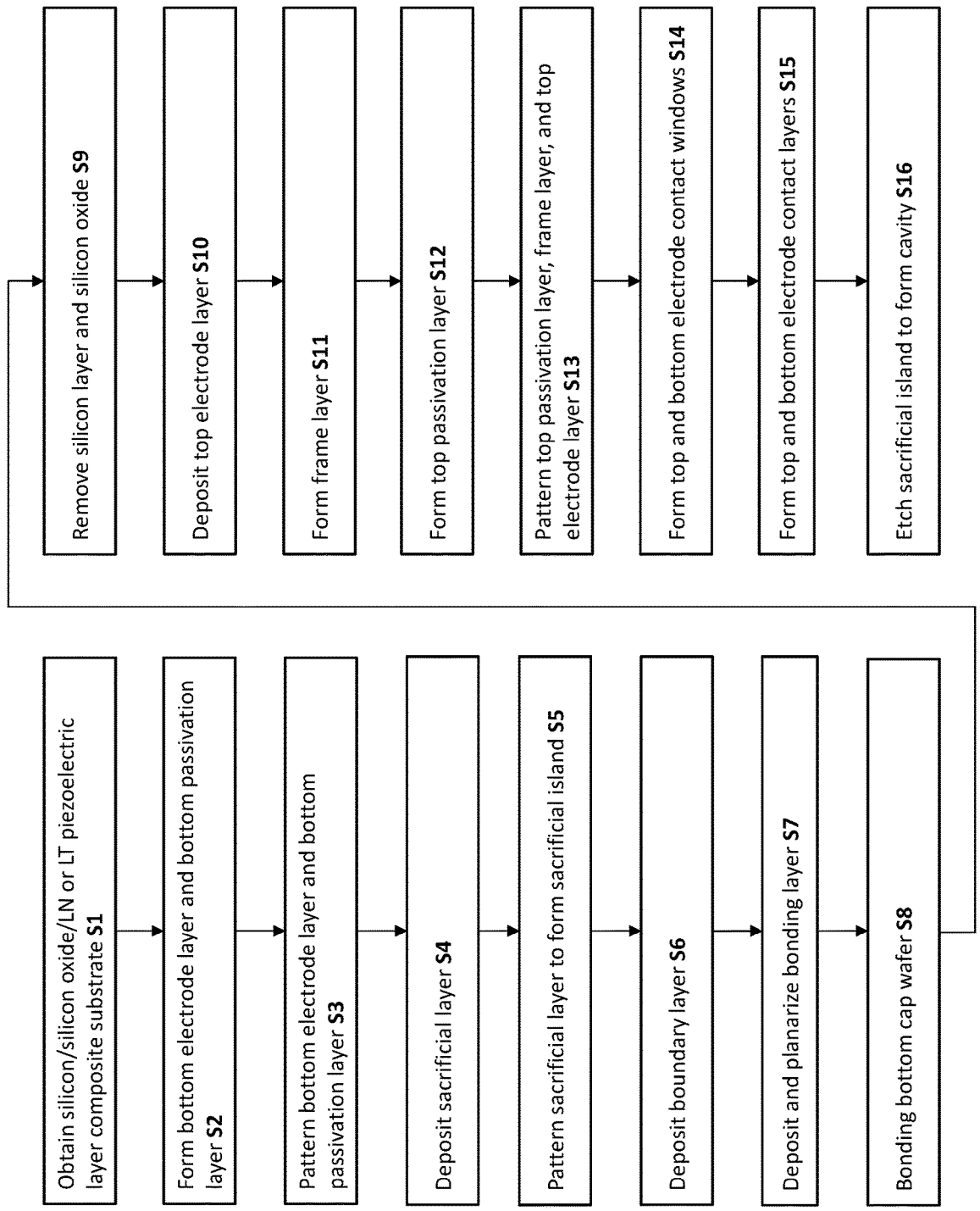
FIG. 2 is a flow chart of a process of fabricating a FBAR structure according to a first process scheme, consistent with an embodiment of the present invention.

FIG. 2 is a flow chart of a process of fabricating a FBAR structure according to the aforementioned first process scheme, consistent with an embodiment of the present disclosure. FIGS. 3-18 are cross-sectional views of structures formed in steps S1-S16 of the process of FIG. 2, according to an embodiment of the present disclosure.

Figure 3:
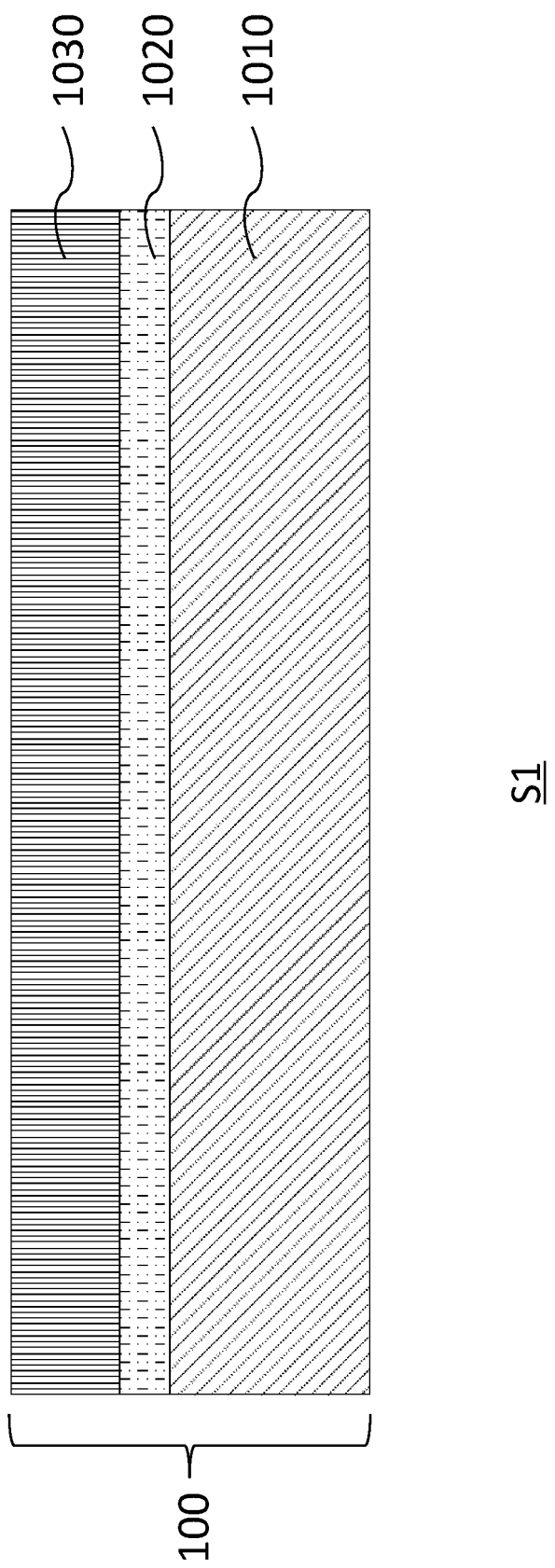
FIGS. 3-18 are cross-sectional views of structures formed in the process of FIG. 2, according to an embodiment of the present disclosure.

As illustrated in FIG. 3, in step S1, a composite substrate 100 is obtained, which may be commercially available silicon substrate/silicon oxide/LN piezoelectric film. Composite substrate 100 has a laminated material structure made up of a first substrate 1010, a silicon oxide layer 1020, and piezoelectric layer 1030. Silicon oxide layer 1020 is disposed on top of first substrate 1010. Piezoelectric layer 1030 is disposed on silicon oxide layer 1020. The material of the substrate 1010 may be silicon, silicon carbide (SiC), aluminum oxide, or a stacked combination thereof. Piezoelectric layer 1030 may be lithium niobate (LN) or lithium tantalate (LT), both of which are piezoelectric materials used to make surface acoustic wave filters.

Figure 4:
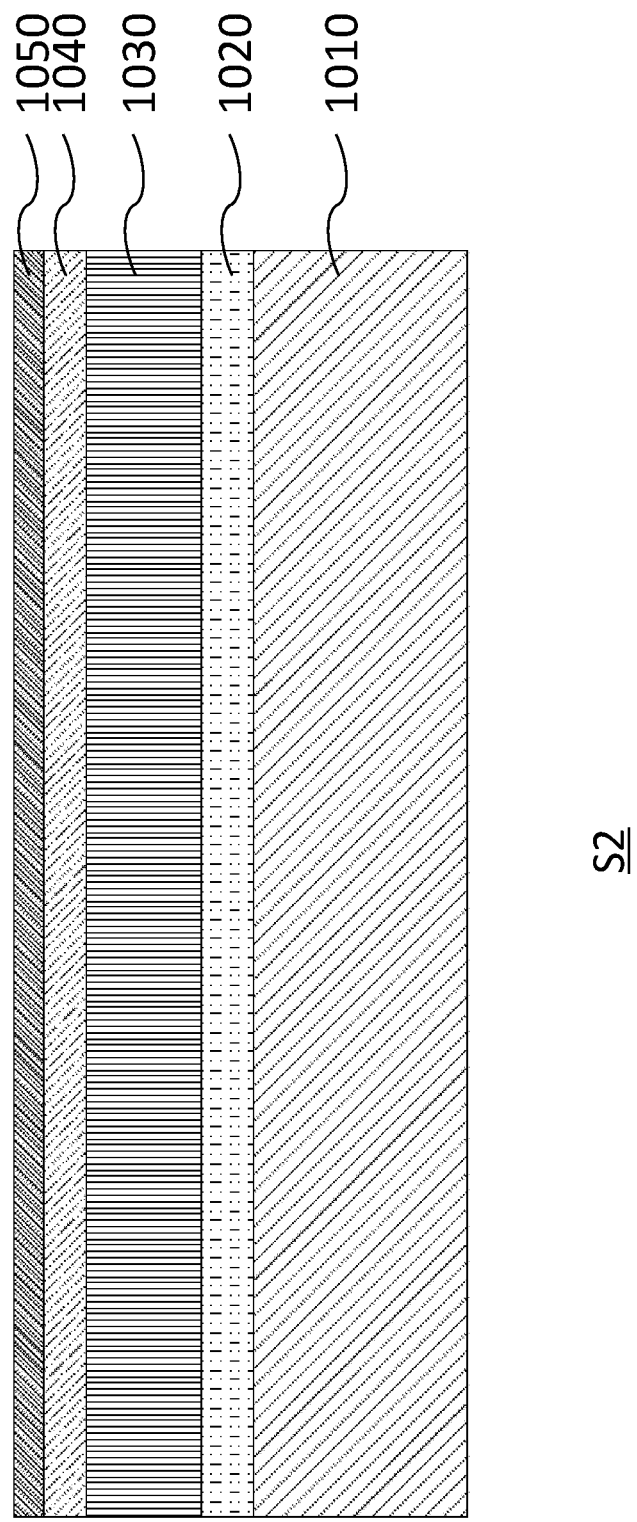

As illustrated in FIG. 4, in step S2, a bottom electrode layer 1040 is deposited on piezoelectric layer 1030, and bottom passivation layer 1050 is deposited on bottom electrode layer 1040. The material of bottom electrode layer 1040 may be any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, bottom electrode layer 1040 includes molybdenum (Mo). Bottom passivation layer 1050 may be made of one or more non-conductive materials such as silicon nitride and aluminum nitride.

Figure 5:
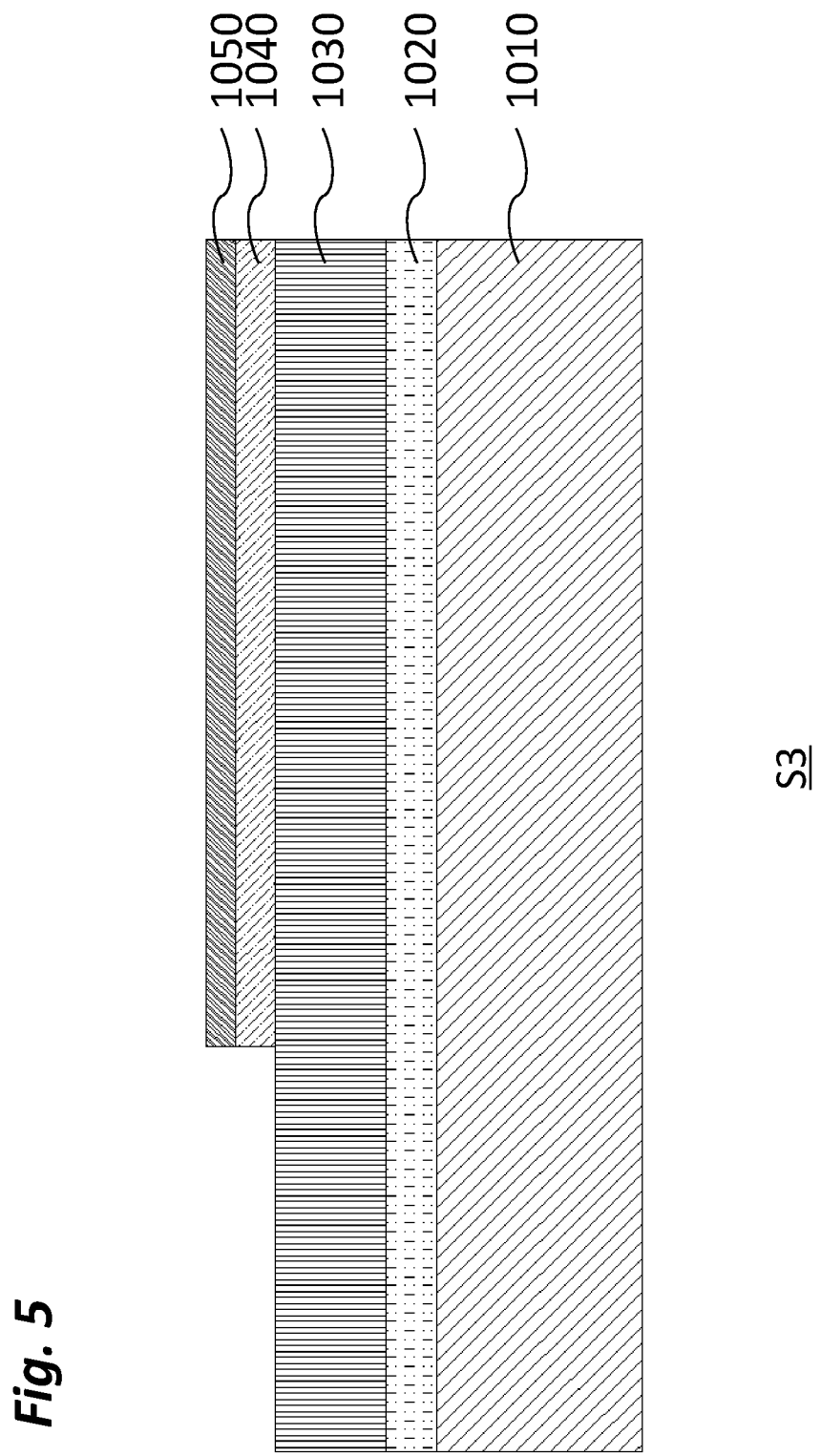

As illustrated in FIG. 5, in step S3, bottom electrode layer 1040 and bottom passivation layer 1050 are patterned and etched to form bottom electrode 1040 and patterned bottom passivation layer 1050. The etching process may be a wet chemical etching process, a plasma port etching process, or a combination thereof. This step allows for precise patterning of bottom electrode 1040 of the FBAR structure.

Figure 6:
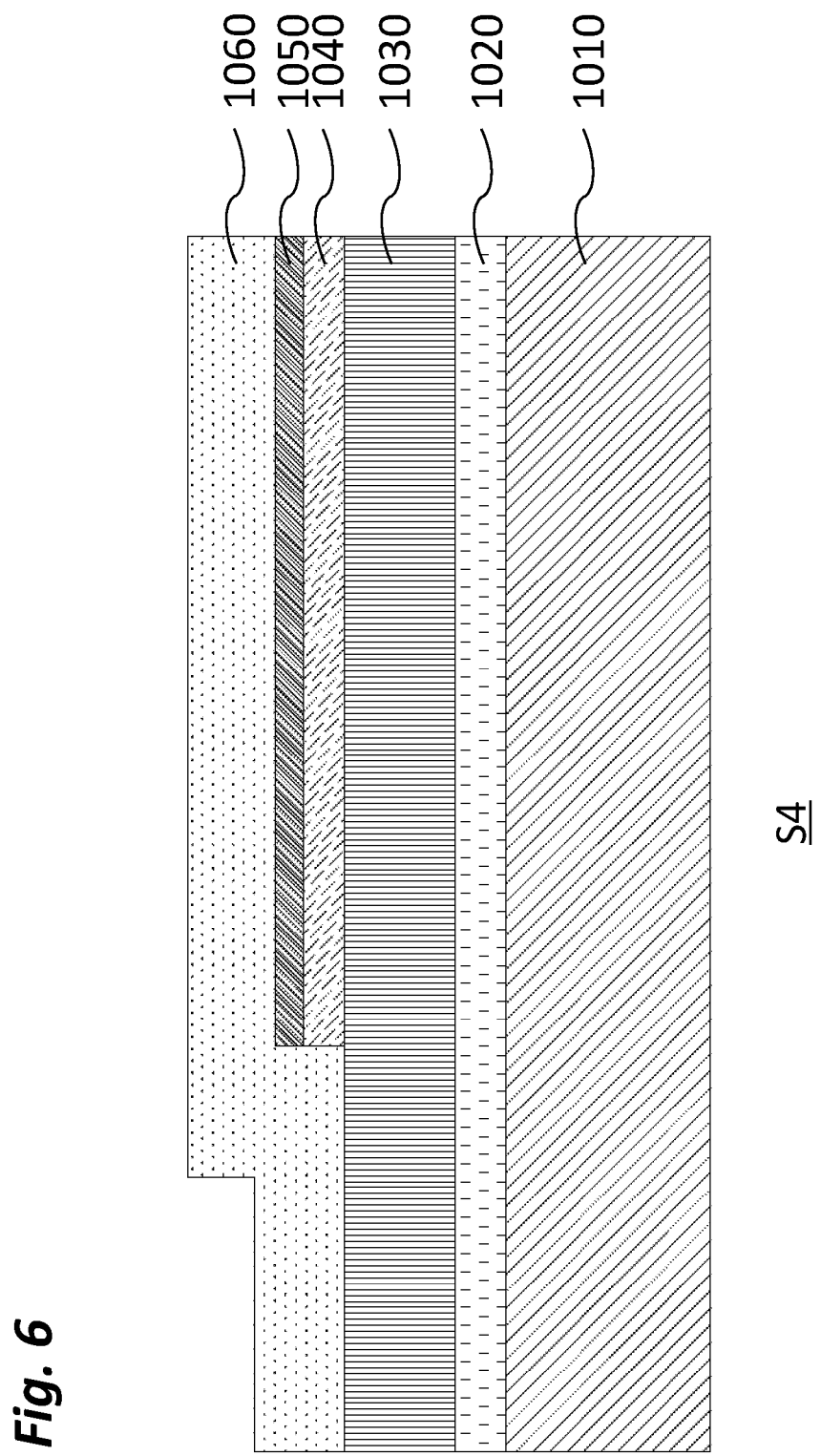

As illustrated in FIG. 6, in step S4, a sacrificial layer 1060 is deposited on the structure illustrated in FIG. 5. Sacrificial layer 1060 is used to form cavity 1000a of the FBAR structure. Sacrificial layer 1060 may include at least one of various types of silicon oxide material, such as pure silicon oxide, phosphor silicate glass (PSG), boron phosphor silicate glass (BPSG), spin on glass (SOG), or fluorinated silicate glass (FSG). Sacrificial layer 1060 may be deposited by using a chemical vapor deposition (CVD) process, a physical vapor deposition (PVD) process, or a combination of both.

Figure 7:
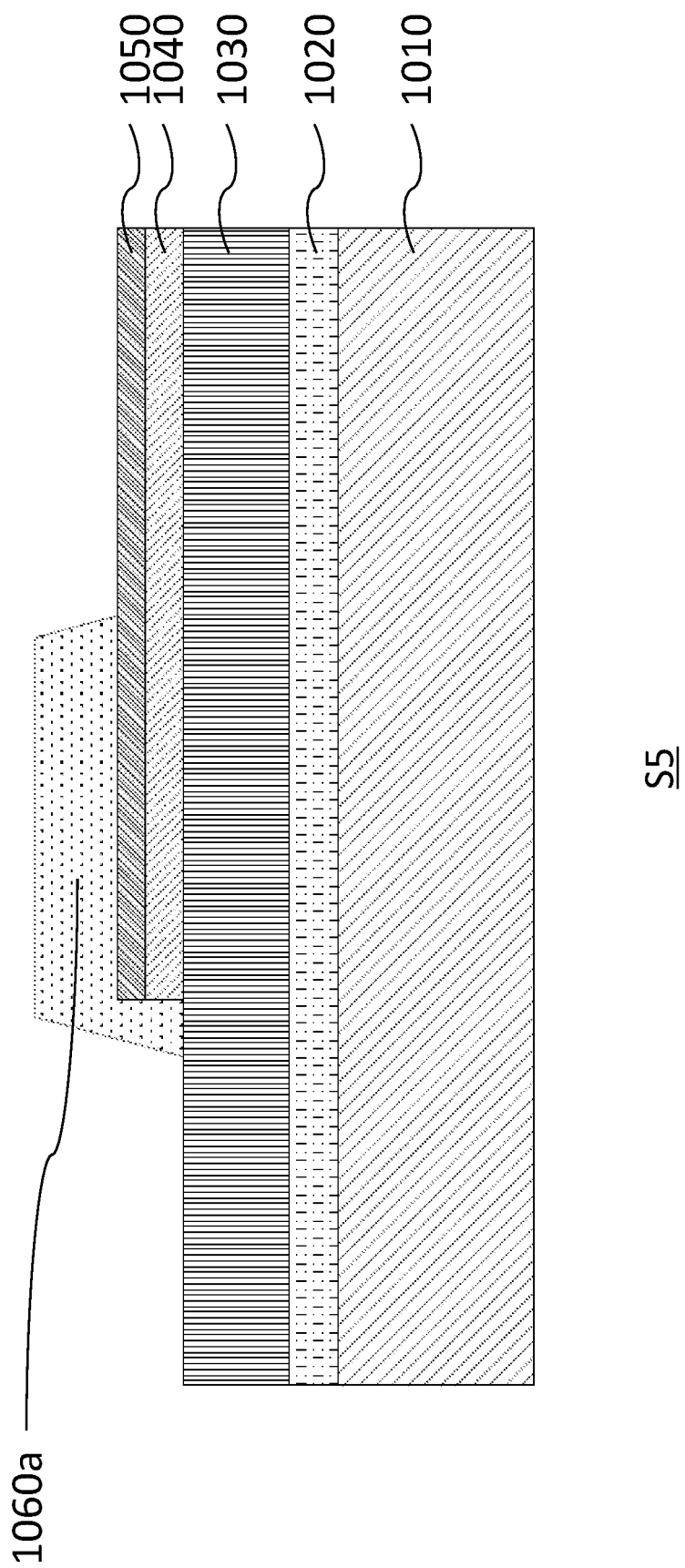

As illustrated in FIG. 7, in step S5, sacrificial layer 1060 is patterned and etched to form a sacrificial island 1060a. The material of sacrificial island 1060a will be removed in a subsequent release etching process, thereby forming cavity 1000a of the FBAR structure. The etching process may be a wet chemical etching process, a plasma etching process, or a combination of those two processes.

Figure 8:
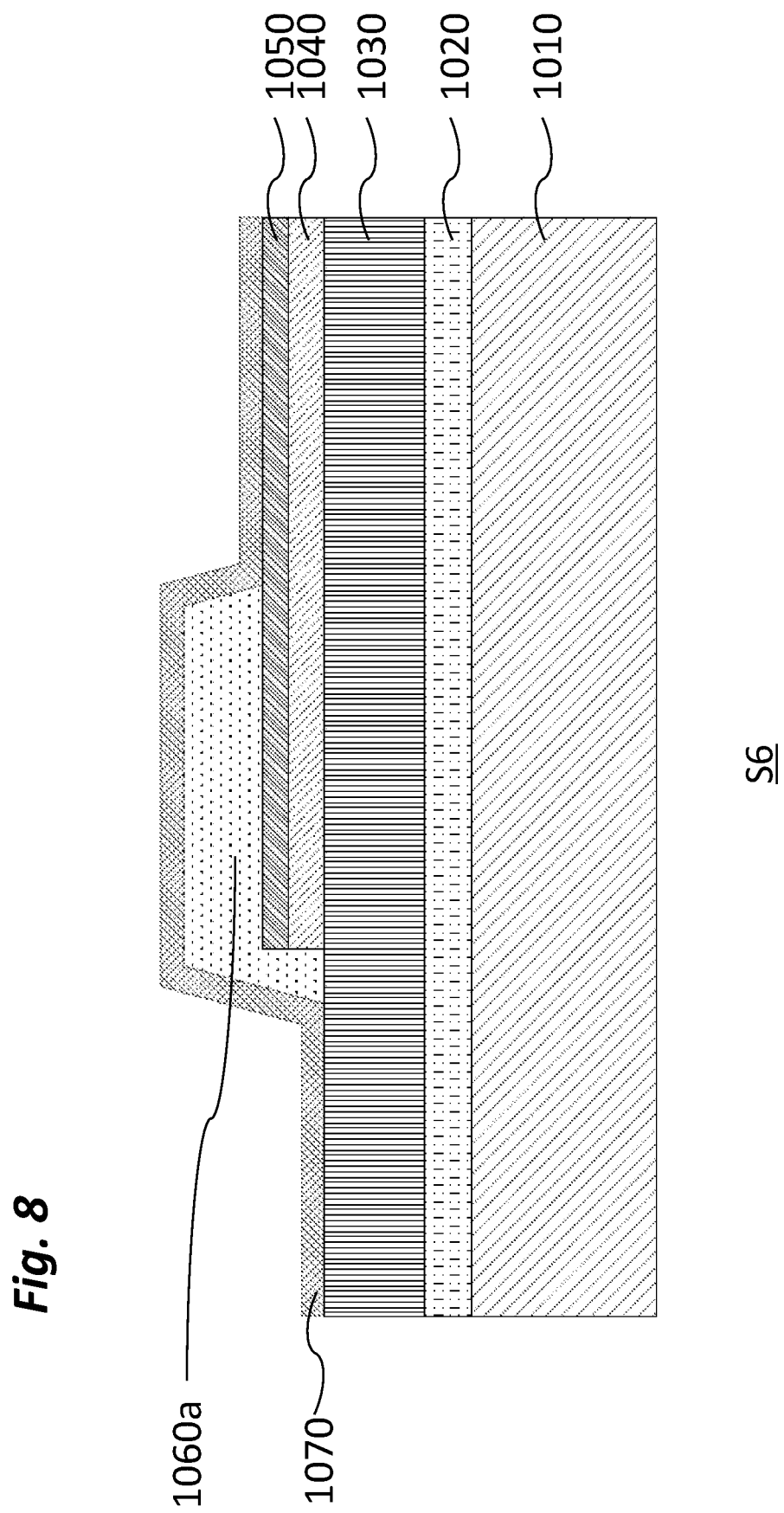

As illustrated in FIG. 8, in step S6, boundary layer 1070 is deposited on the structure of FIG. 7. A portion of boundary layer 1070 that surrounds sacrificial island 1060a functions as an etch stop layer during the subsequent release etching process for removing sacrificial island 1060a to form cavity 1000a. The material of boundary layer 1070 may be non-conductive materials such as silicon (Si), silicon nitride (SiN), aluminum nitride (AlN), polysilicon, amorphous silicon, or a stacked combination of two or more of those materials.

Figure 9:
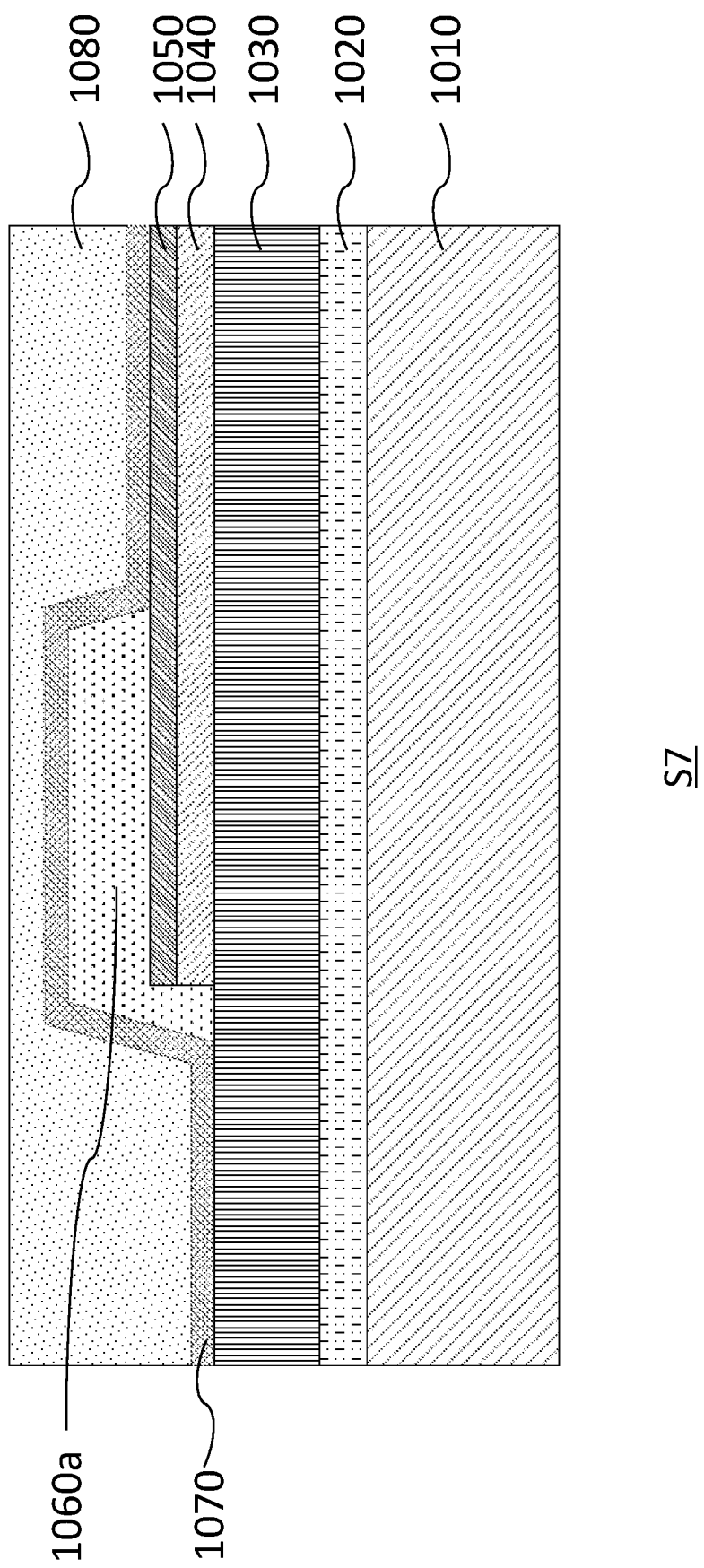

As illustrated in FIG. 9, in step S7, bonding layer 1080 is deposited on the structure of FIG. 8. Then, the surface of bonding layer 1080 is planarized and polished. Bonding layer 1080 may be deposited by using a chemical vapor deposition (CVD) process, a physical vapor deposition (PVD) process, or a combination of those two processes. Bonding layer 1080 is used to bond bottom cap wafer 1100. The material of bonding layer 1080 may be silicon oxide, silicon nitride, ethyl silicate, etc., or a stacked combination of two or more of those materials. In the present embodiment, silicon oxide is used. The surface planarization and polishing may be performed by a chemical mechanical polishing (CMP) process.

Figure 10:
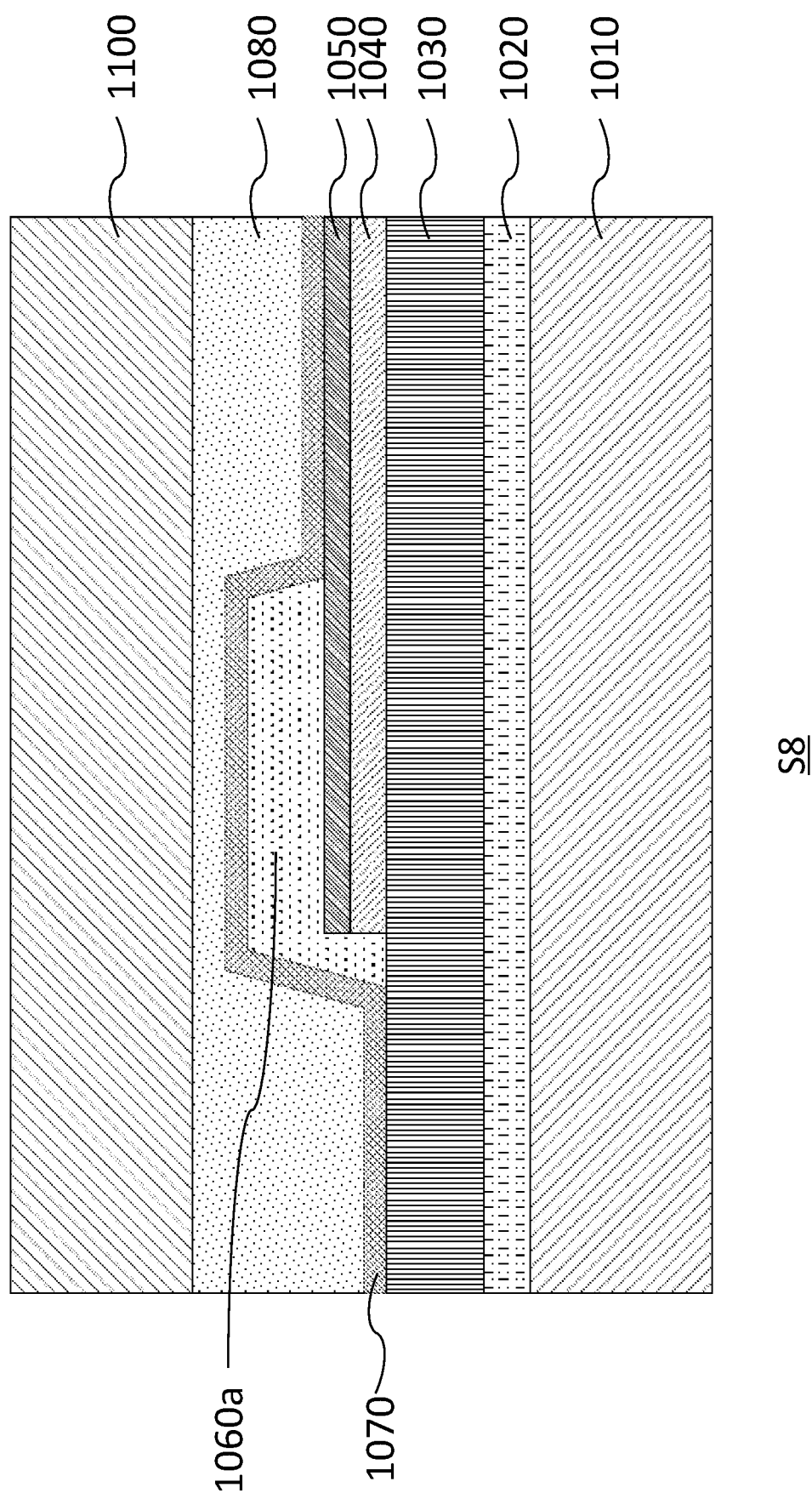

As illustrated in FIG. 10, in step S8, bottom cap wafer 1100 is bonded to bonding layer 1080. Bottom cap wafer 1100 may include a material such as silicon (Si), carbon silicon (SiC), aluminum oxide, quartz, glass, or sapphire ($Al_2O_3$). In the present embodiment, bottom cap wafer 1100 includes silicon.

Figure 11:
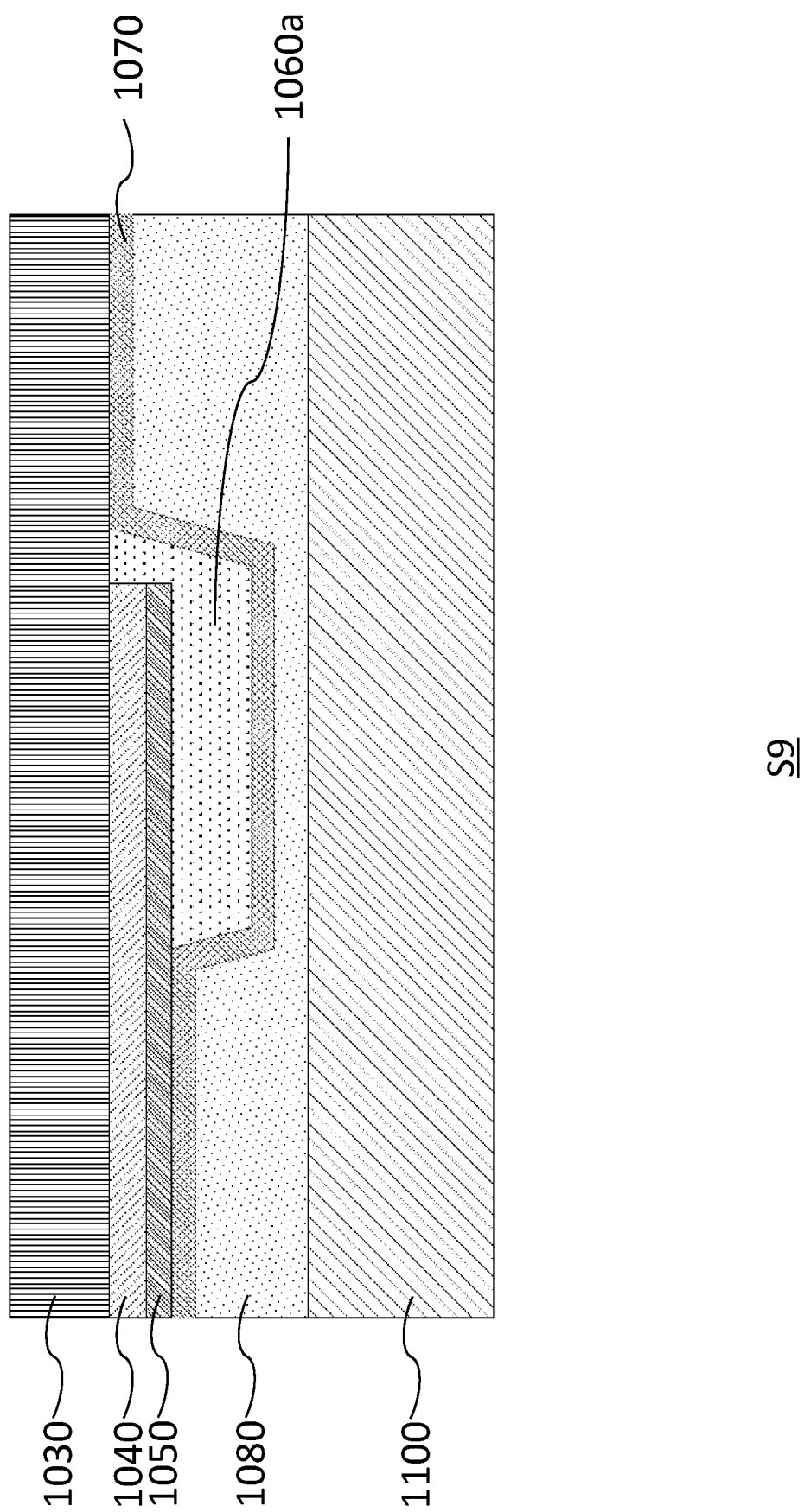

As illustrated in FIG. 11, in step S9, the structure illustrated in FIG. 10 is flipped over, and first substrate 1010 and silicon oxide layer 1020 are removed to expose piezoelectric layer 1030. The removing of first substrate 1010 and silicon oxide layer 1020 may be performed by a grinding process, a plasma dry etching process, a wet chemical etching process, or a combination thereof. In the present embodiment, first substrate 1010 is made of silicon material, and is removed by a combination of grinding and wet chemical etching, or a combination of grinding and plasma dry etching. Silicon oxide layer 1020 may be removed by plasma dry etching, wet chemical etching, or a combination of the two.

Figure 12:
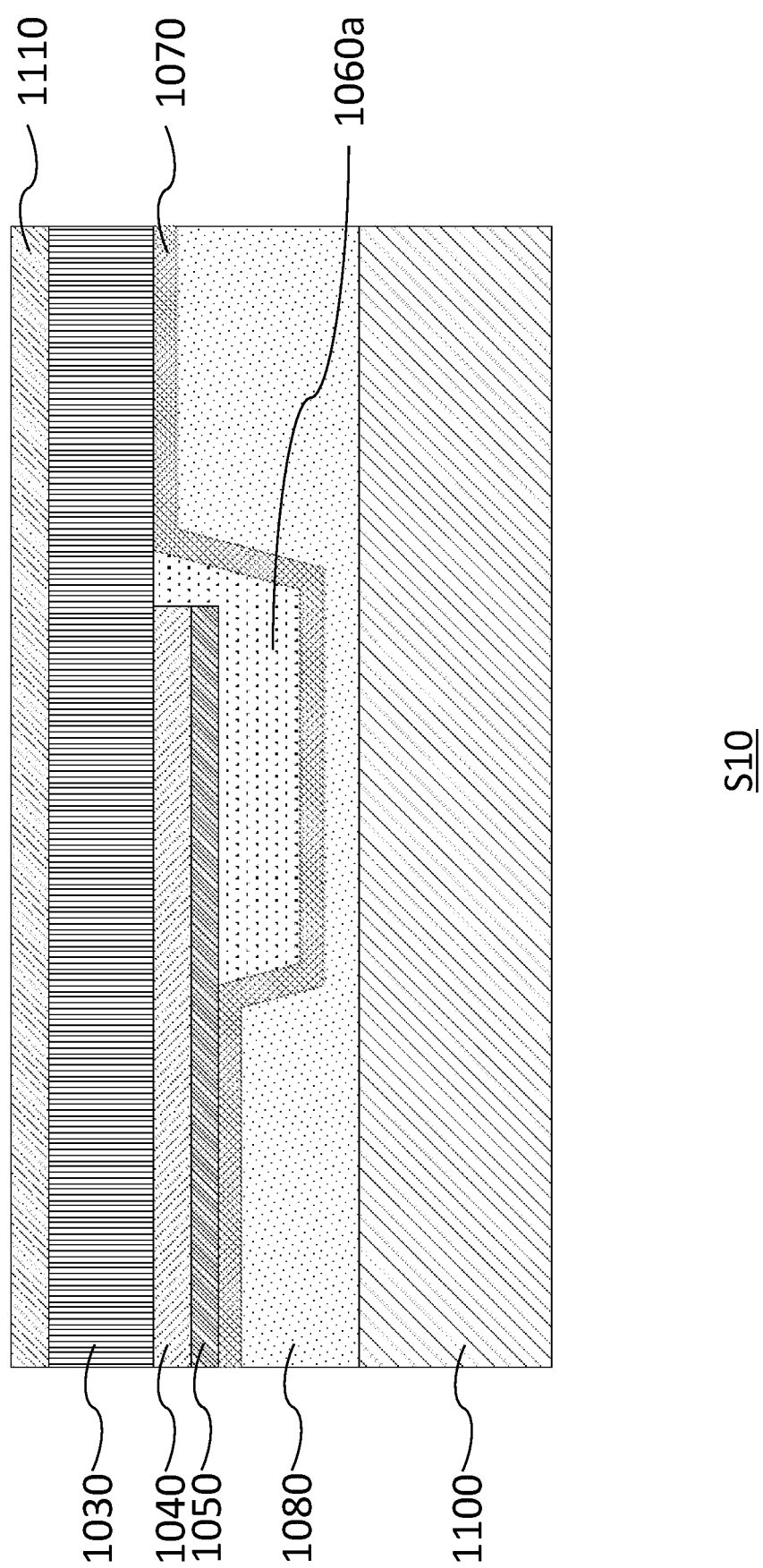

As illustrated in FIG. 12, in step S10, a top electrode layer 1110 is deposited on piezoelectric layer 1030. The material of top electrode layer 1110 may be any suitable conductive material, such as various metal materials with conductive properties or a stack of several conductive metal materials, such as molybdenum (Mo), aluminum (Al), copper (Cu), platinum (Pt), Tantalum (Ta), tungsten (W), palladium (Pd), ruthenium (Ru), etc. In the present embodiment, top electrode layer 1110 includes molybdenum (Mo).

Figure 13:
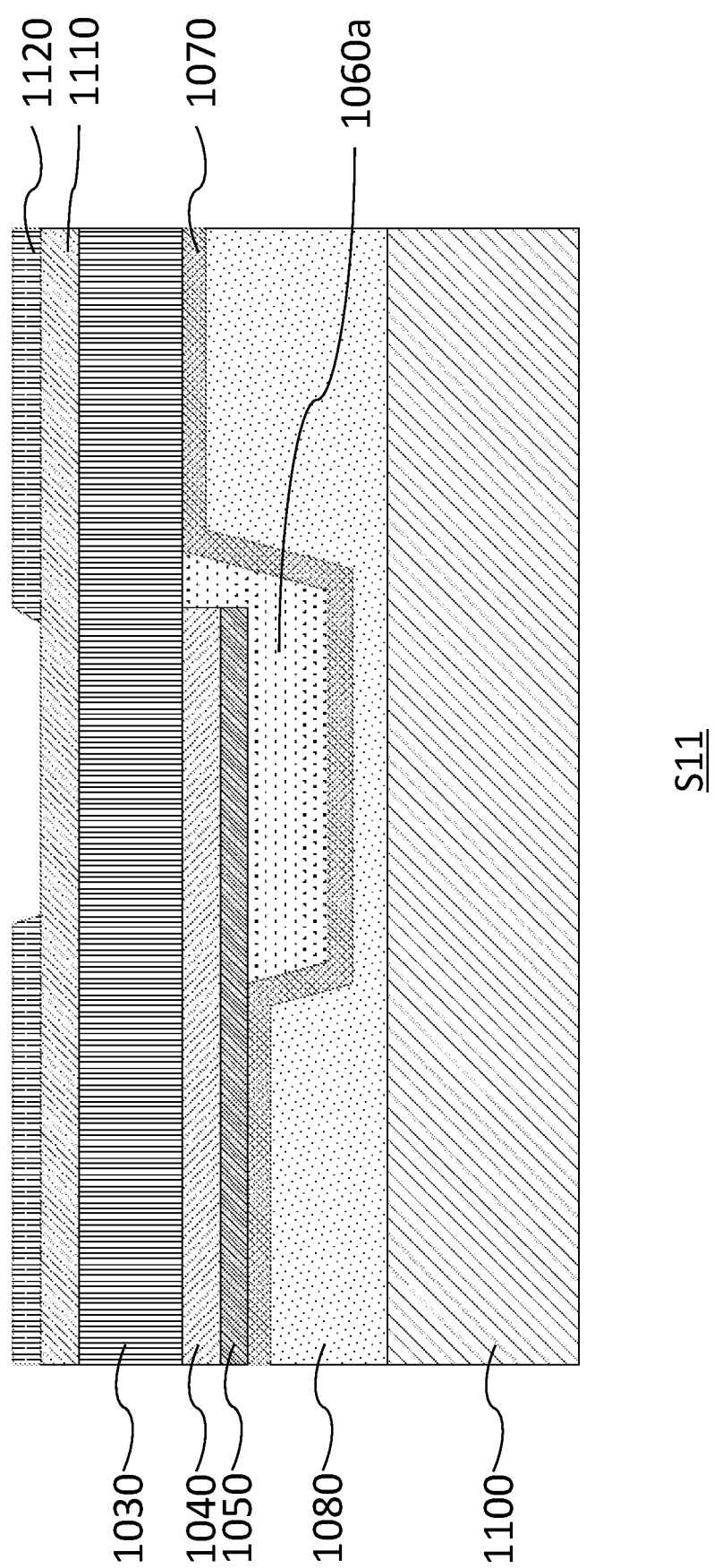

As illustrated in FIG. 13, in step S11, frame layer 1120 is formed on top electrode layer 1110 and is patterned. Frame layer 1120 may be made of a conductive material, which may be the same material as top electrode layer 1110, or may be a different material from top electrode layer 1110. The patterning of frame layer 1120 may be obtained either by using a lift-off process or by using a patterned etching method. In one embodiment, when top electrode layer 1110 and frame layer 1120 layer are made of the same material, a layer with a total thickness of top electrode 1110 and frame layer 1120 may be deposited on piezoelectric layer 1030 at one time, and then the deposited layer is patterned and etched to a certain amount to form a step provided by frame layer 1120. In the embodiment illustrated in FIGS. 1 and 13, frame layer 1120 is formed on top electrode layer 1110. In some alternative embodiments, frame layer 1120 may not be included in the FBAR structure. Alternatively or additionally, in some embodiments, a frame layer may be formed on a lower surface of bottom electrode 1040. In such embodiments, the frame layer may be deposited on bottom electrode layer 1040 in step S2, after the deposition of bottom electrode layer 1040 on piezoelectric layer 1030 and before the deposition of bottom passivation layer 1050.

Figure 14:
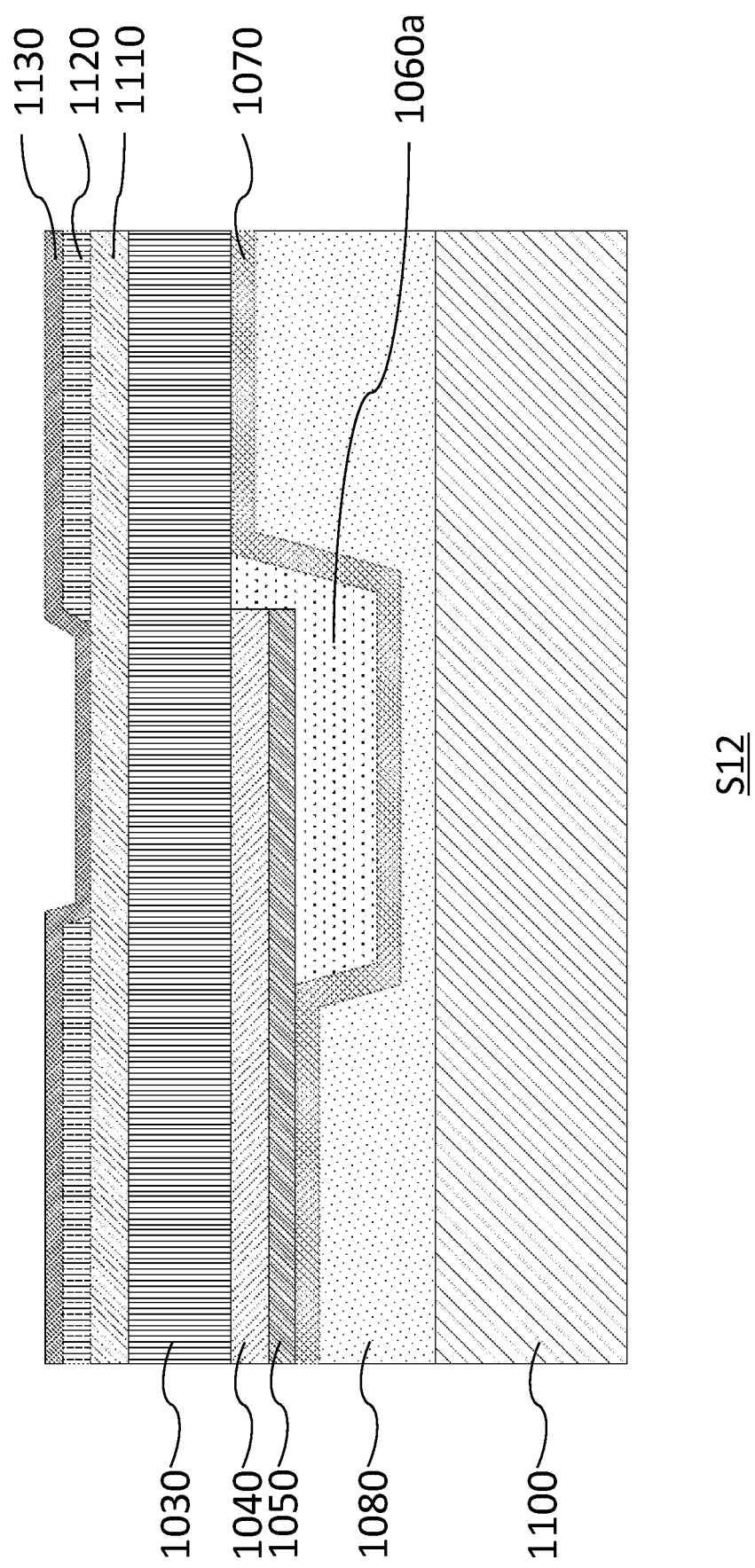

As illustrated in FIG. 14, in step S12, top passivation layer 1130 is deposited on top electrode layer 1110 layer and frame layer 1120. The material of top passivation layer 1130 can be silicon nitride (SiN), aluminum nitride (AlN), silicon oxide (SiO2), silicon oxynitride (SiNO), etc., or a stacked combination of those materials.

Figure 15:
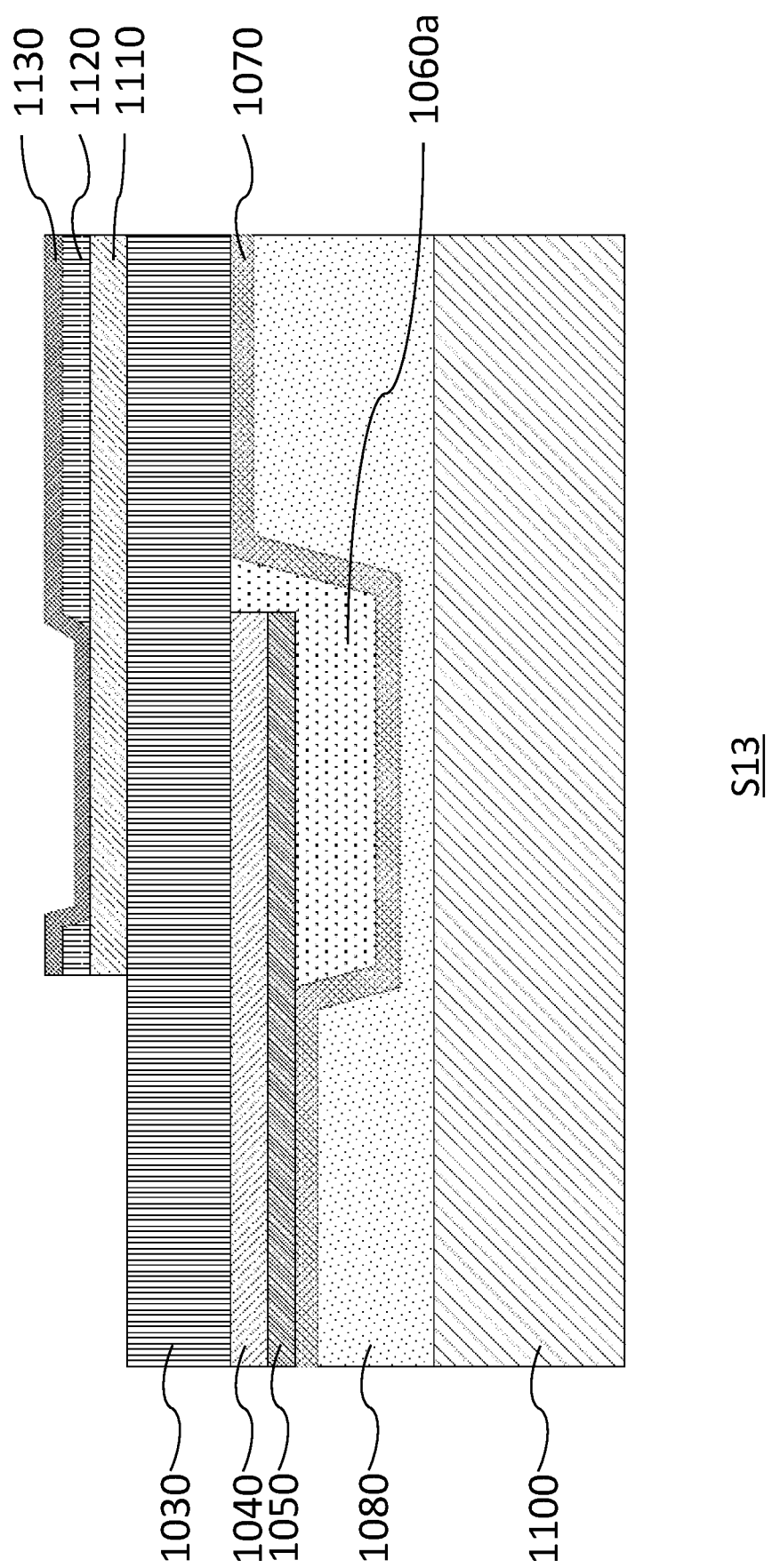

As illustrated in FIG. 15, in step S13, top passivation layer 1130, frame layer 1120, and top electrode layer 1110 are patterned by etching, to form patterned top passivation layer 1130, patterned frame layer 1120, and top electrode 1110. Patterned frame layer 1120 includes raised structure 1125 (FIG. 1) along an edge of top electrode 1110. Raised structure 1125 protrudes upwards, away from top electrode 1110. The etching process may be a plasma etching process, a wet chemical etching process, or a combination of the two. This step allows for precise patterning of top electrode 1110 of the FBAR structure. In combination of the precise patterning of bottom electrode 1040, parasitic capacitance of the FBAR structure may be minimized.

Figure 16:
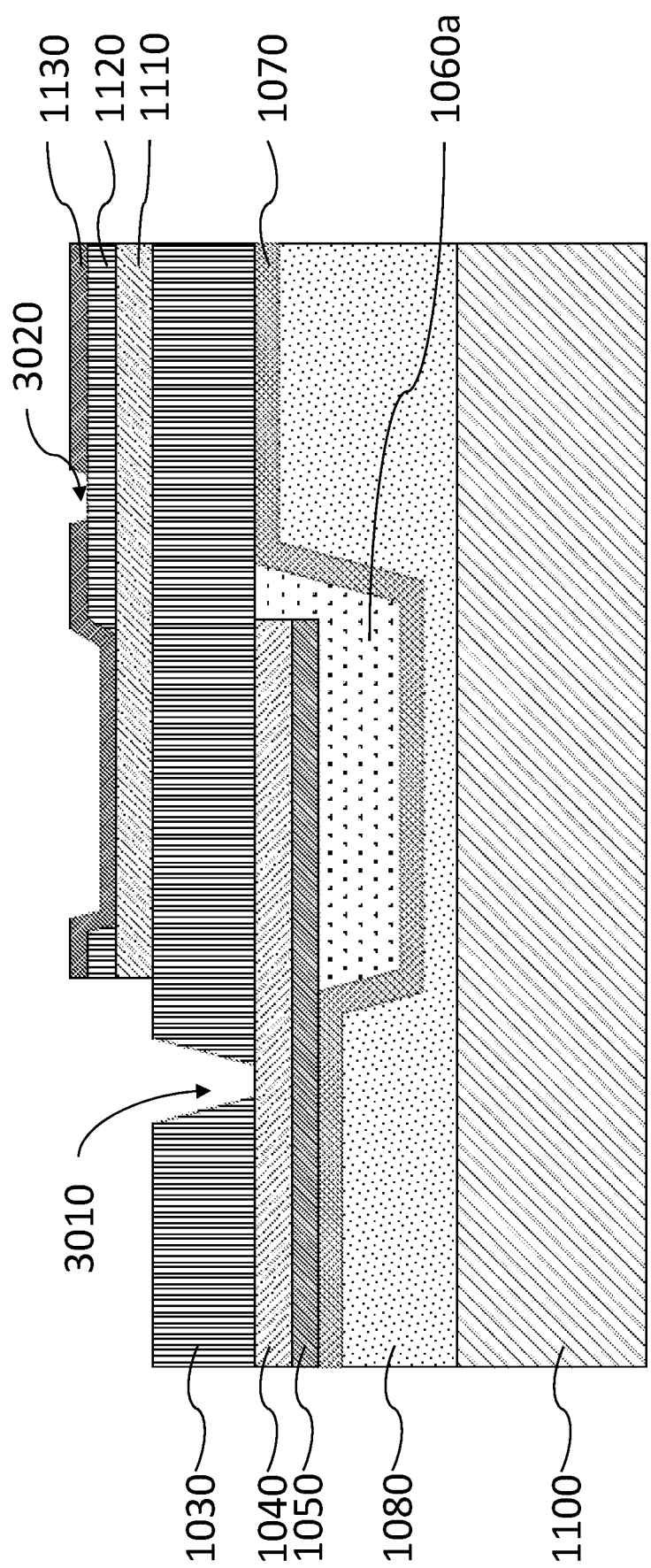

As illustrated in FIG. 16, in step S14, piezoelectric layer 1030 is patterned by etching to form bottom electrode contact window 3010 of bottom electrode 1040 of the FBAR structure. Top passivation layer 1130 is patterned by etching to form top electrode contact window 3020 for top electrode 1110 of the FBAR structure.

Figure 17:
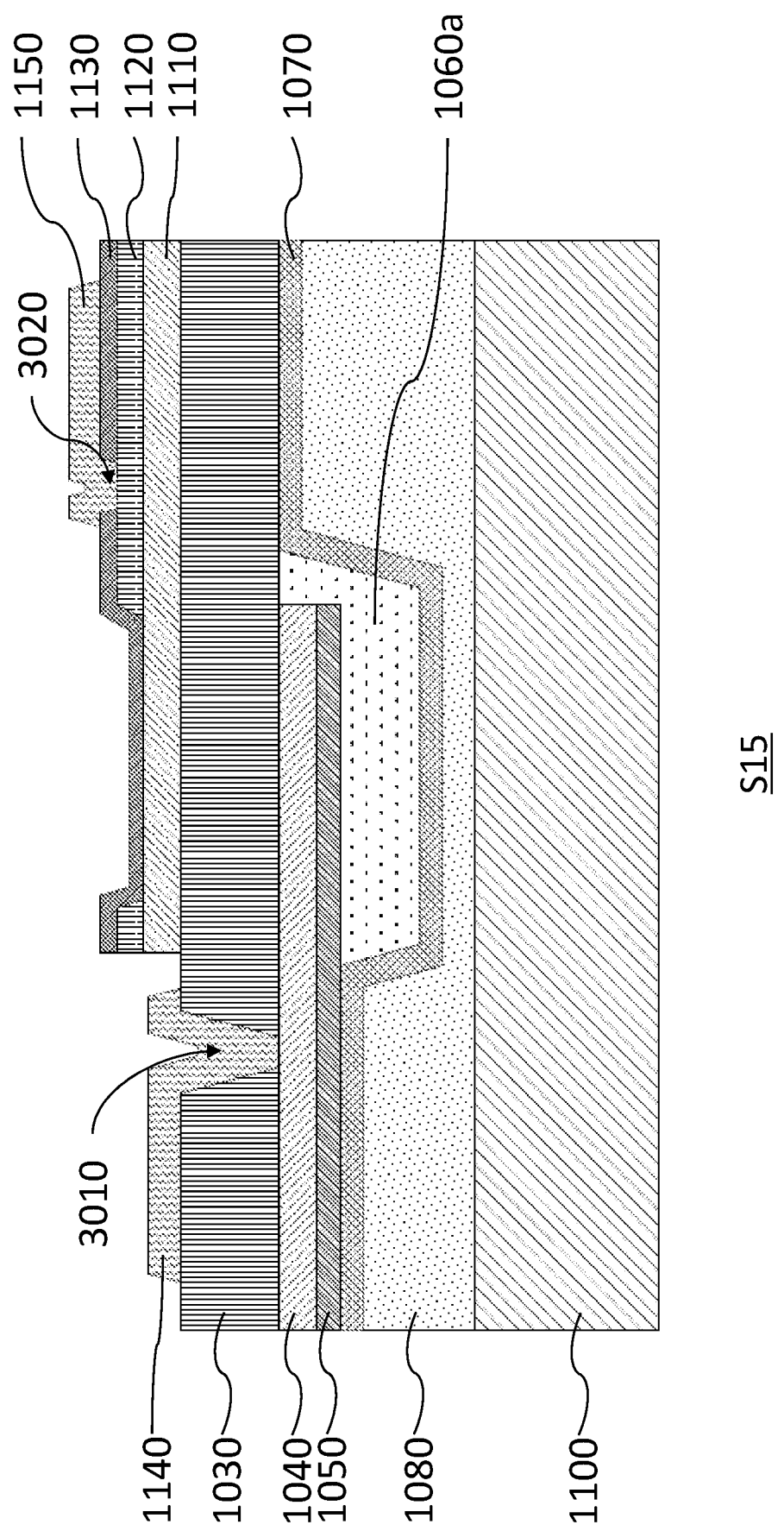

As illustrated in FIG. 17, in step S15, bottom electrode contact layer 1140 for contacting bottom electrode 1040, and top electrode contact layer 1150 for contacting top electrode 1110, are formed. Bottom electrode contact layer 1140 is electrically connected to bottom electrode 1040 via bottom electrode contact window 3010. Top electrode contact layer 1150 is electrically connected to top electrode 1110 and frame layer 1120 via top electrode contact window 3020. The material of bottom and top electrode contact layers 1140 and 1150 may be metal materials, such as aluminum (Al), copper (Cu), gold (Au), titanium (Ti), tungsten (W), platinum (Pt), etc., or a stacked combination of two or more of those materials.

Figure 18:
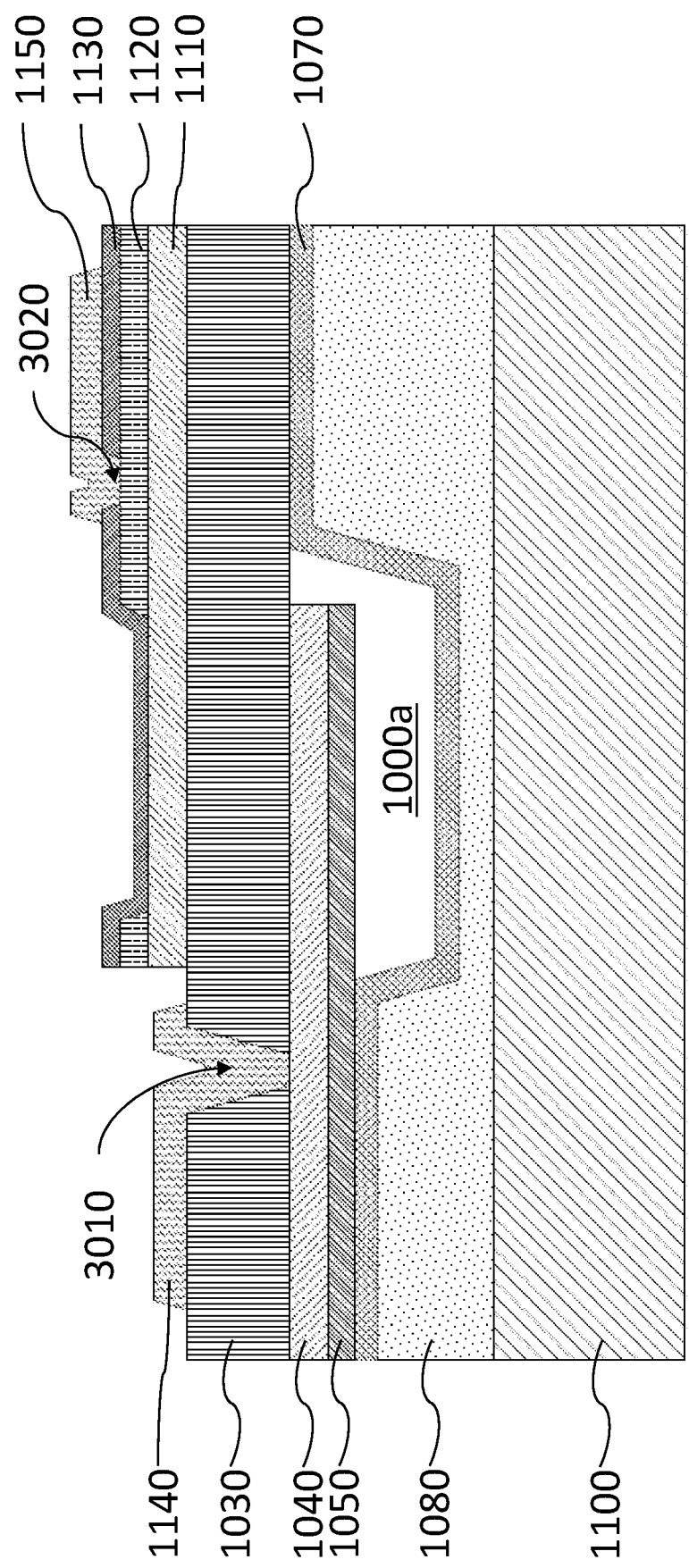

As illustrated in FIG. 18, in step S16, a portion of piezoelectric layer 1030 disposed above sacrificial island 1060a (FIG. 17) is etched to form a releasing hole connected to sacrificial island 1060a. Due to the location of the cross-section illustrated in FIG. 18, FIG. 18 does not show the location of the releasing hole. After the releasing hole is formed, sacrificial island 1060a is etched and released to form cavity 1000a under piezoelectric layer 1030. In the present embodiment, sacrificial island 1060a is made of silicon oxide, and the etching and releasing process of sacrificial island 1060a may be performed by using hydrofluoric acid solution wet etching, buffered oxide etchant (BOE) solution wet etching, or hydrofluoric acid vapor corrosion, or a combination of those processes. The boundary of cavity 1000a is defined by boundary layer 1070.

Figure 19:
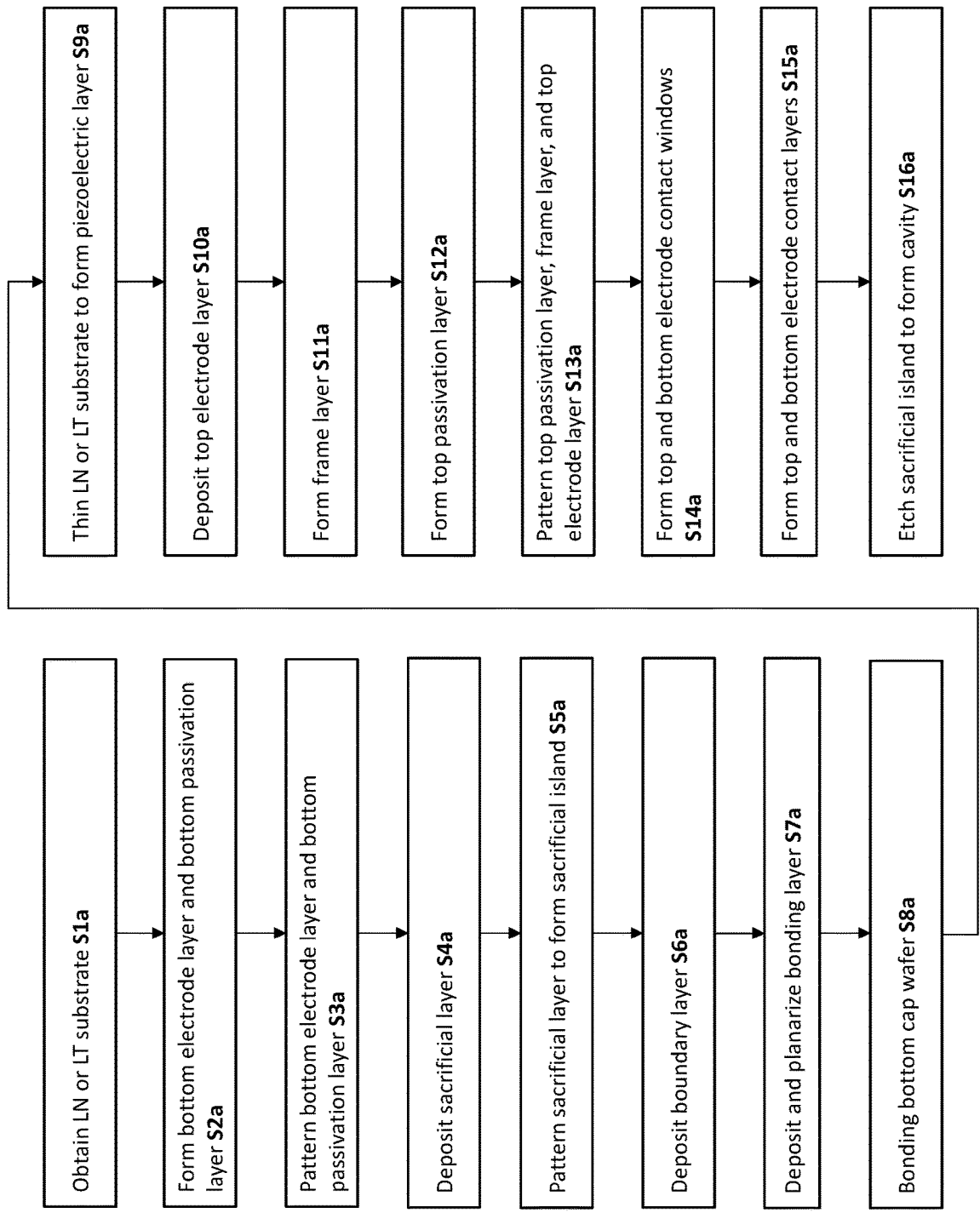
FIG. 19 is a flow chart of a process of fabricating a FBAR structure according to a second process scheme, consistent with an embodiment of the present disclosure.

FIG. 19 is a flow chart of a process of fabricating a FBAR structure according to the aforementioned second process scheme, consistent with an embodiment of the present disclosure. FIGS. 20-28 are cross-sectional views of structures formed in S1a-S9a of the process of FIG. 19, according to an embodiment of the present disclosure.

Figure 20:
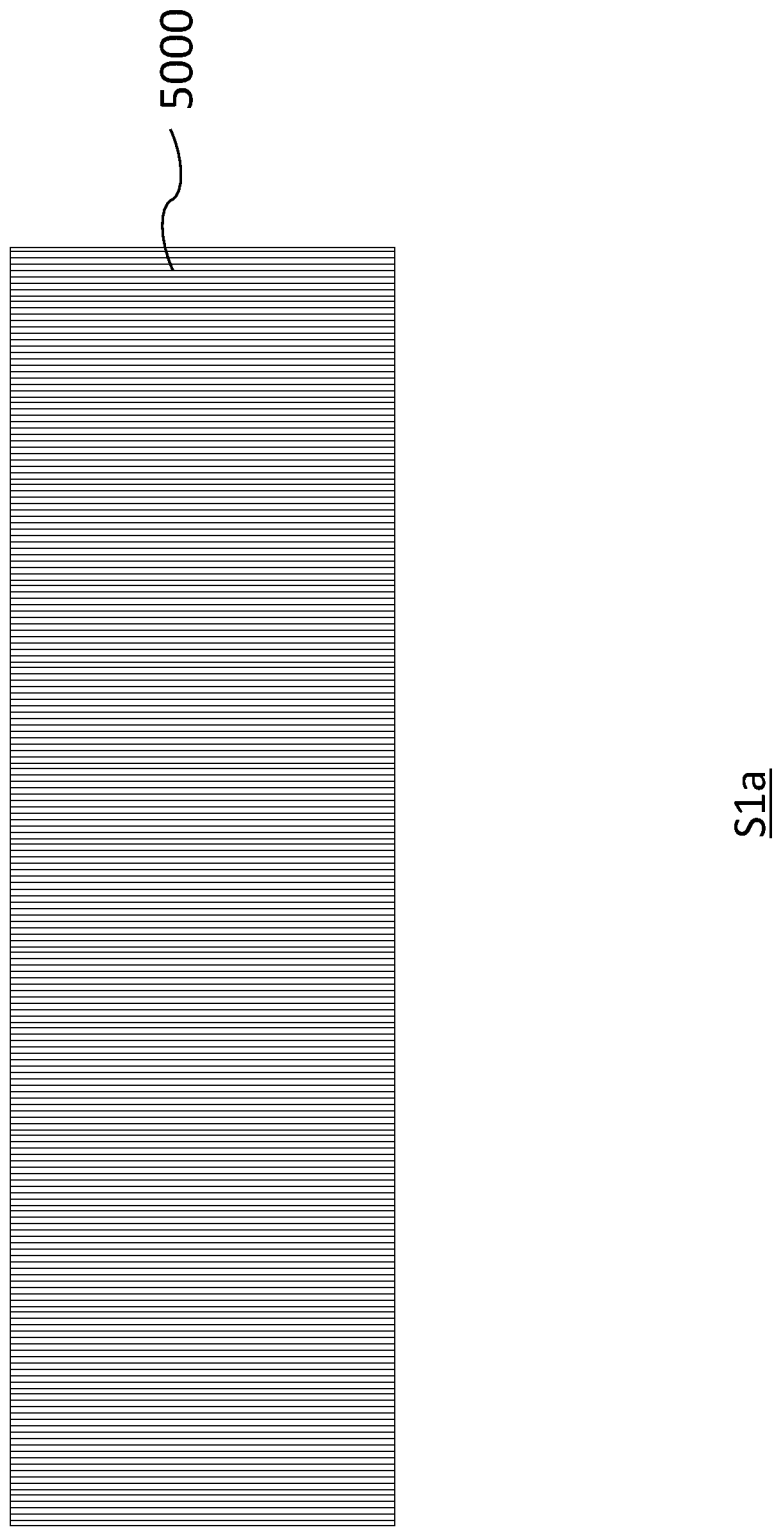
FIGS. 20-28 are cross-sectional views of structures formed in the process of FIG. 19, according to an embodiment of the present disclosure.

As illustrated in FIG. 20, in step S1a, an LN or LT piezoelectric material substrate 5000 is obtained, which may be a commercially available LN or LT piezoelectric material substrate.

Figure 21:
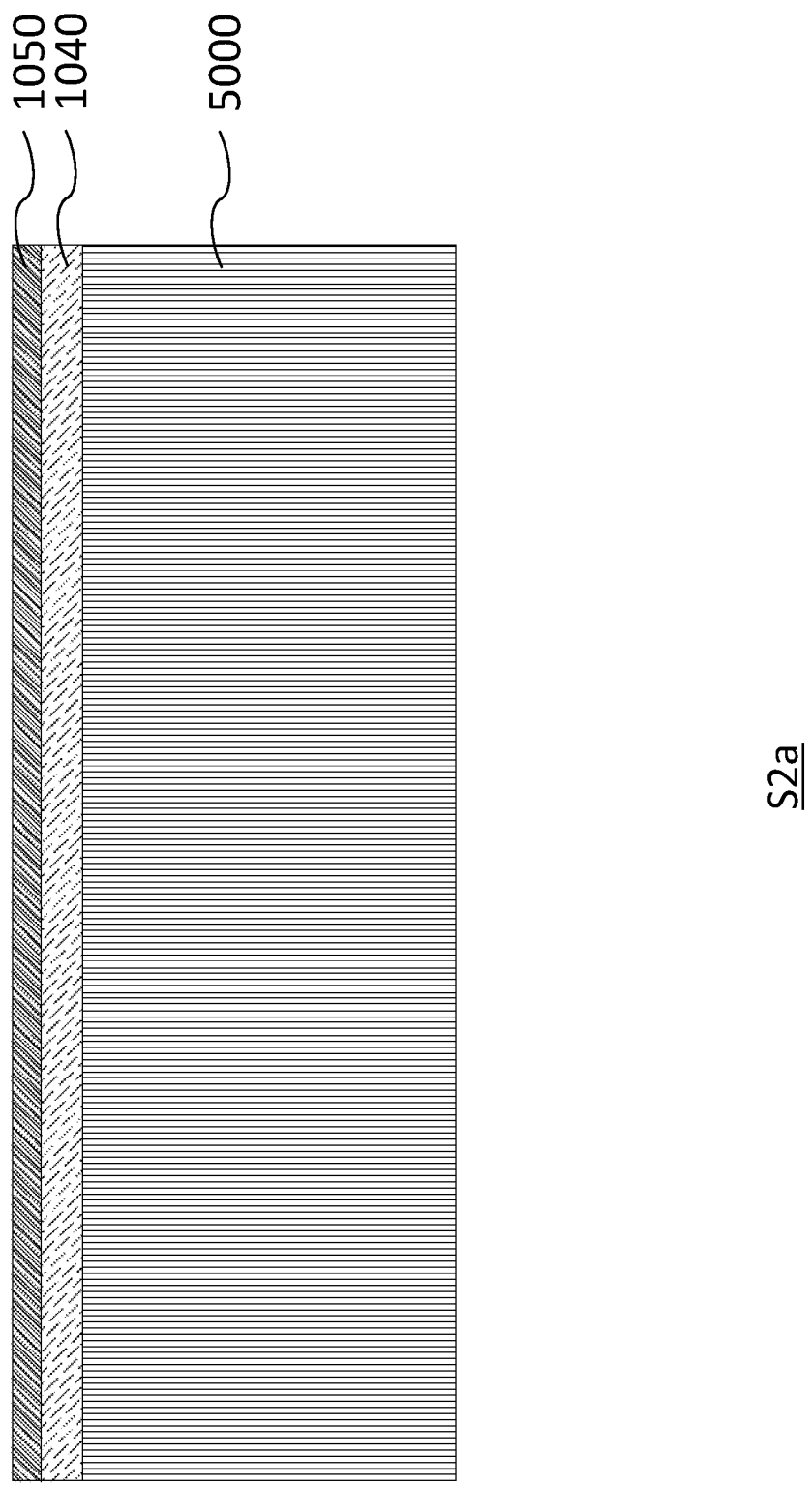

As illustrated in FIG. 21, in step S2a, bottom electrode layer 1040 is deposited on piezoelectric material substrate 5000, and bottom passivation layer 1050 is deposited on bottom electrode layer 1040. The material of bottom electrode layer 1040 may be any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, bottom electrode layer 1040 includes molybdenum (Mo). Bottom passivation layer 1050 may be made of one or more non-conductive materials such as silicon nitride and aluminum nitride.

Figure 22:
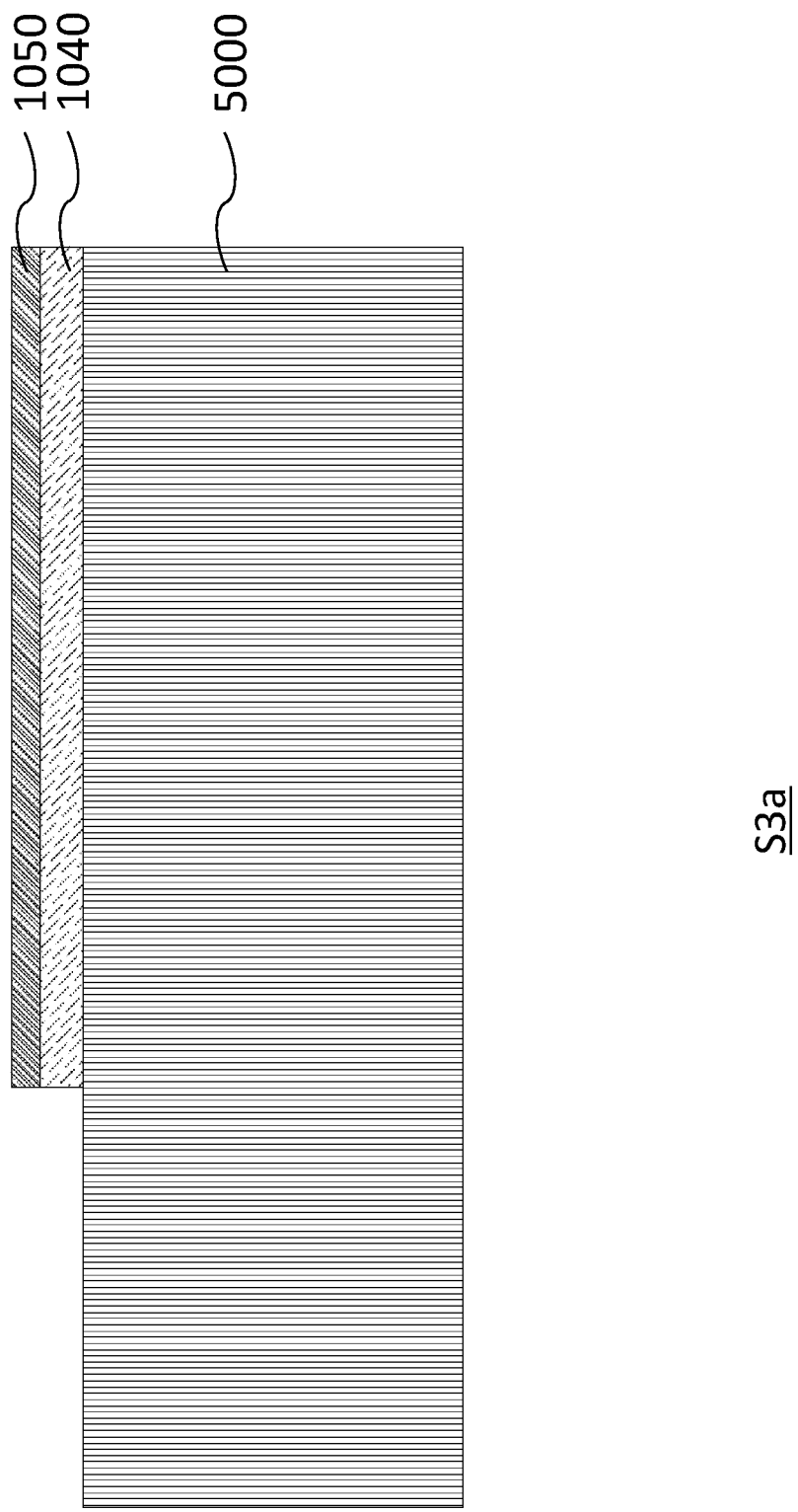

As illustrated in FIG. 22, in step S3a, bottom electrode layer 1040 and bottom passivation layer 1050 are patterned and etched to form bottom electrode 1040 and patterned bottom passivation layer 1050. The etching process may be a wet chemical etching process, a plasma port etching process, or a combination thereof. This step allows for precise patterning of bottom electrode 1040 of the FBAR structure.

Figure 23:
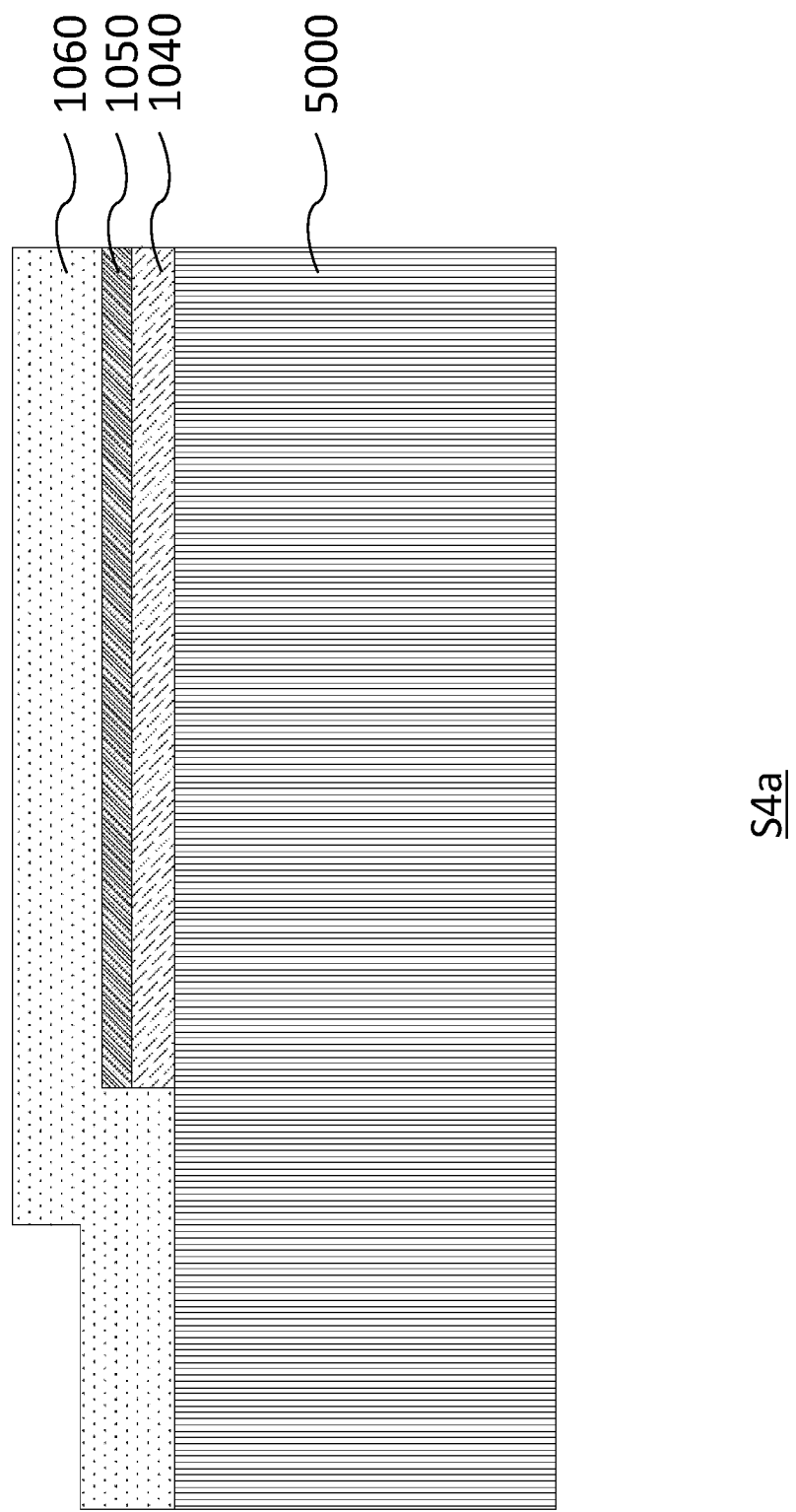

As illustrated in FIG. 23, in step S4a, sacrificial layer 1060 is deposited on the structure illustrated in FIG. 22. Sacrificial layer 1060 is used to form cavity 1000a (FIG. 1) of the FBAR structure. Sacrificial layer 1060 may include at least one of various types of silicon oxide material, such as pure silicon oxide, phosphor silicate glass (PSG), boron phosphor silicate glass (BPSG), spin on glass (SOG), or fluorinated silicate glass (FSG). Sacrificial layer 1060 may be deposited by using a chemical vapor deposition (CVD) process, a physical vapor deposition (PVD) process, or a combination of both.

Figure 24:
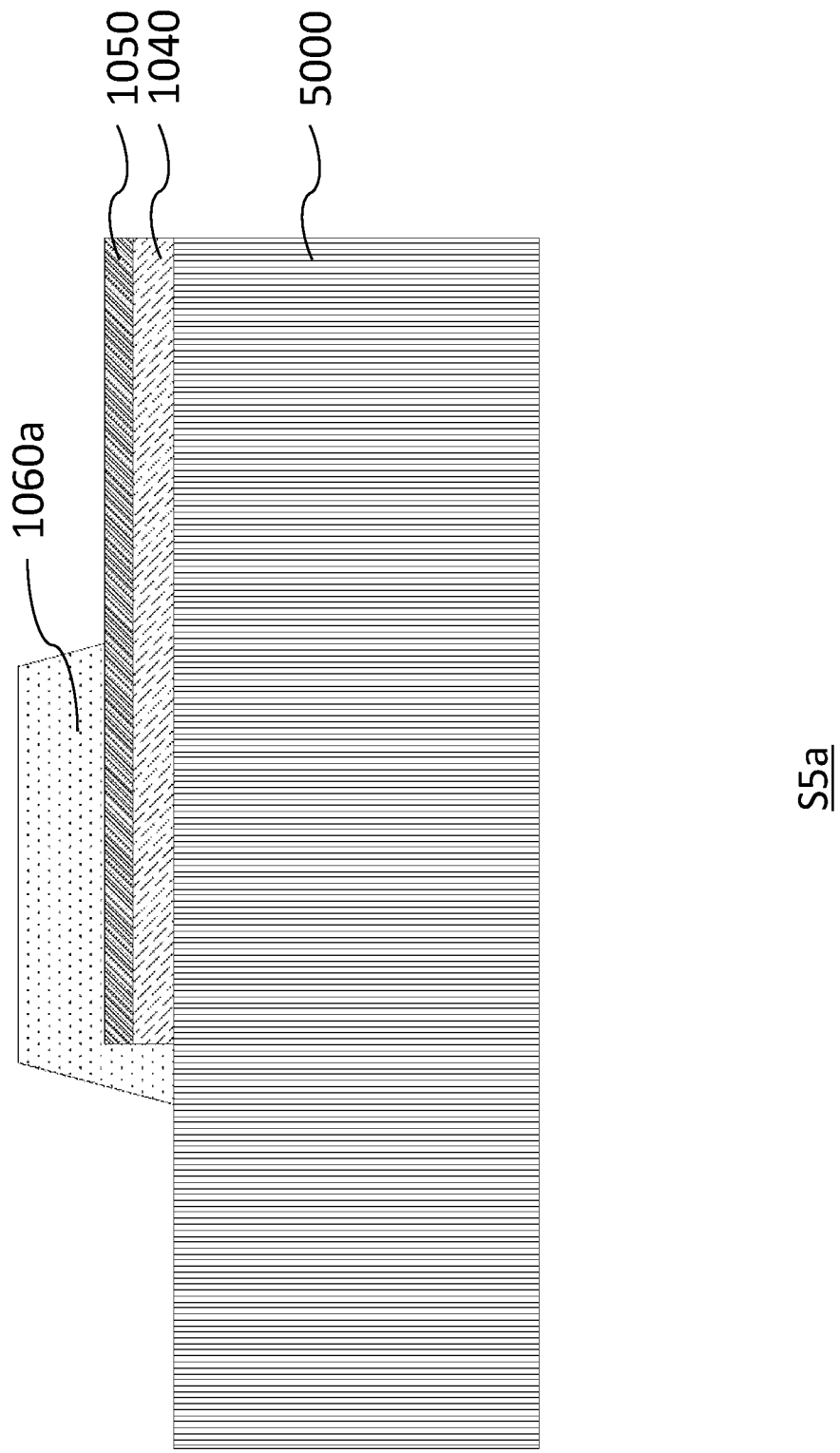

As illustrated in FIG. 24, in step S5a, sacrificial layer 1060 is patterned and etched to form sacrificial island 1060a. The material of sacrificial island 1060a will be removed in a subsequent release etching process, thereby forming cavity 1000a of the FBAR structure. The etching process may be a wet chemical etching process, a plasma etching process, or a combination of those two processes.

Figure 25:
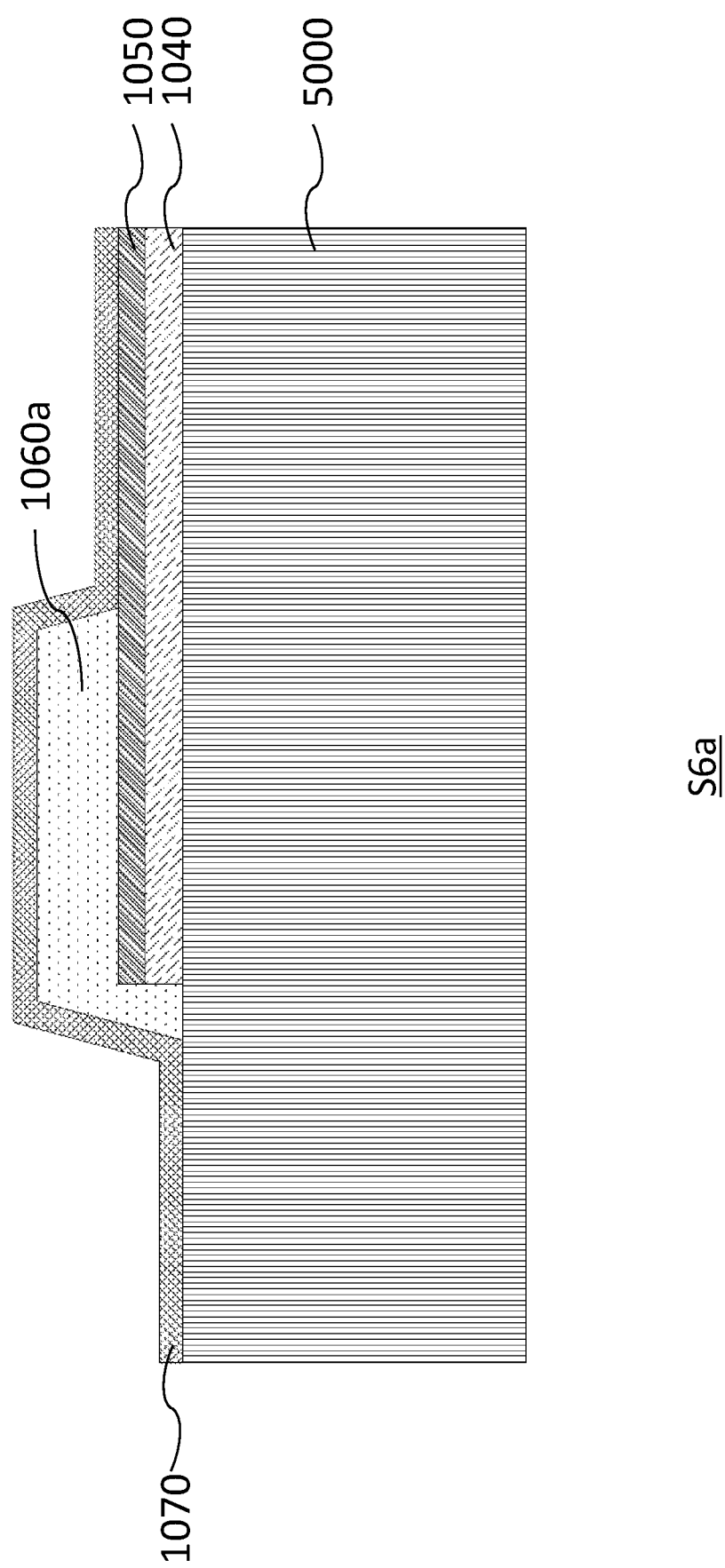

As illustrated in FIG. 25, in step S6a, boundary layer 1070 is deposited on the structure of FIG. 24. A portion of boundary layer 1070 that surrounds sacrificial island 1060a functions as an etch stop layer during the subsequent release etching process for removing sacrificial island 1060a to form cavity 1000a. The material of boundary layer 1070 may be non-conductive materials such as silicon (Si), silicon nitride (SiN), aluminum nitride (AlN), polysilicon, amorphous silicon, or a stacked combination of two or more of those materials.

Figure 26:
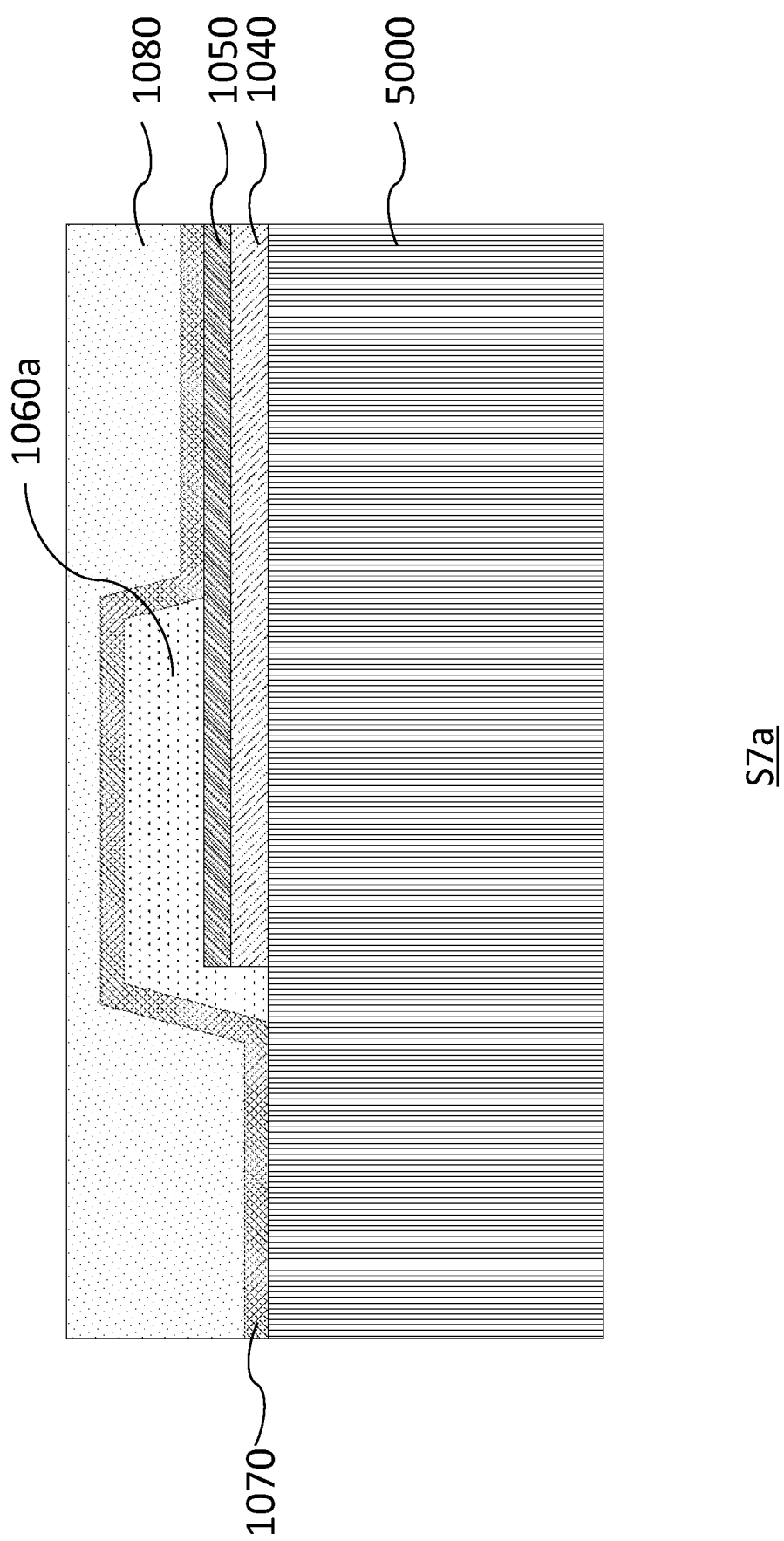

As illustrated in FIG. 26, in step S7a, bonding layer 1080 is deposited on the structure of FIG. 25. Then, the surface of bonding layer 1080 is planarized and polished. Bonding layer 1080 is used to bond bottom cap wafer 1100. The material of bonding layer 1080 may be silicon oxide, silicon nitride, ethyl silicate, etc., or a stacked combination of two or more of those materials. In the present embodiment, silicon oxide is used. The surface planarization and polishing may be performed by a chemical mechanical polishing (CMP) process.

Figure 27:
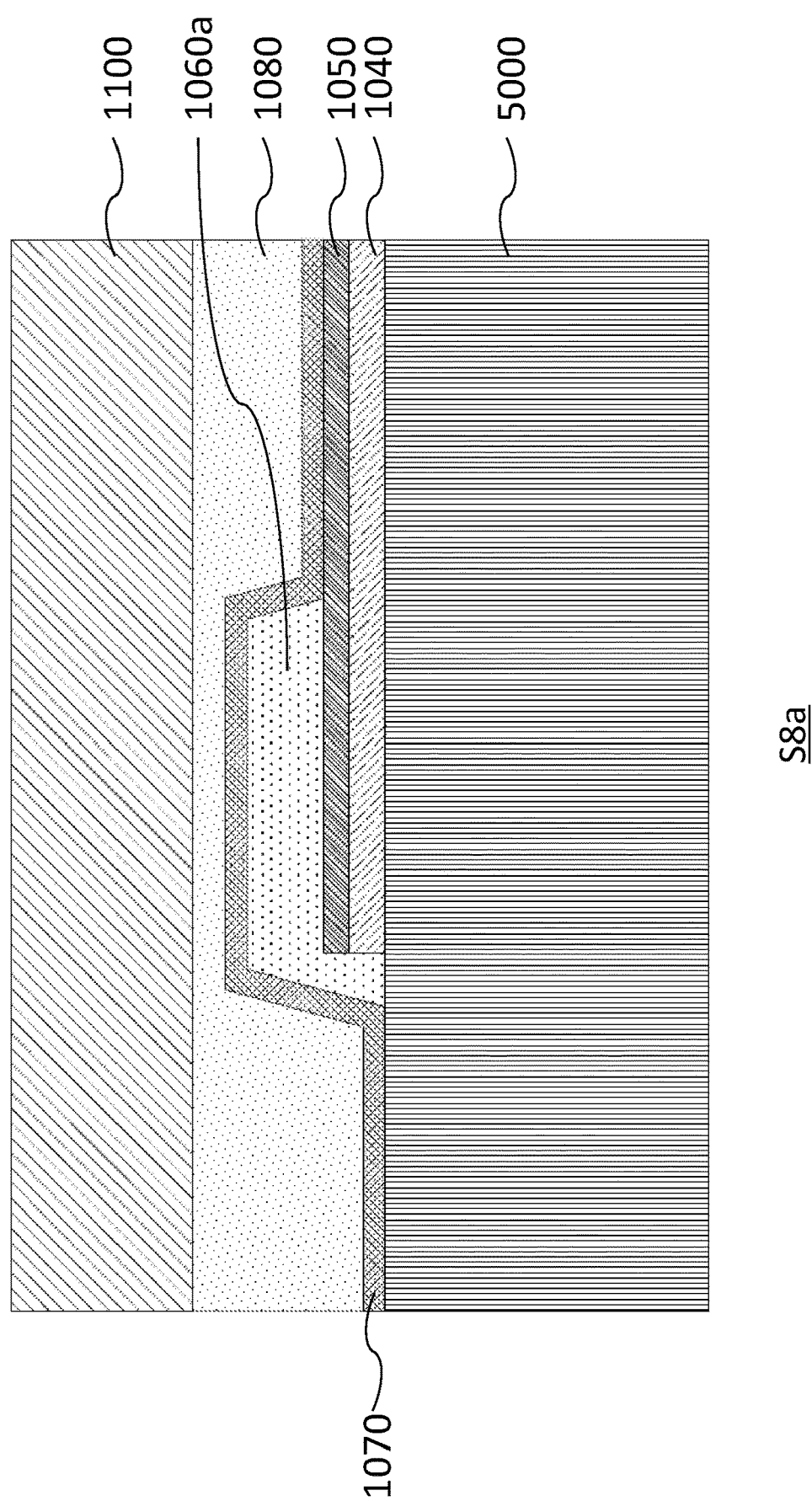

As illustrated in FIG. 27, and in step S8a, bottom cap wafer 1100 is bonded to bonding layer 1080. Bottom cap wafer 1100 may include a material such as silicon (Si), carbon silicon (SiC), aluminum oxide, quartz, glass, or sapphire ($Al_2O_3$). In the present embodiment, bottom cap wafer 1100 includes silicon.

Figure 28:
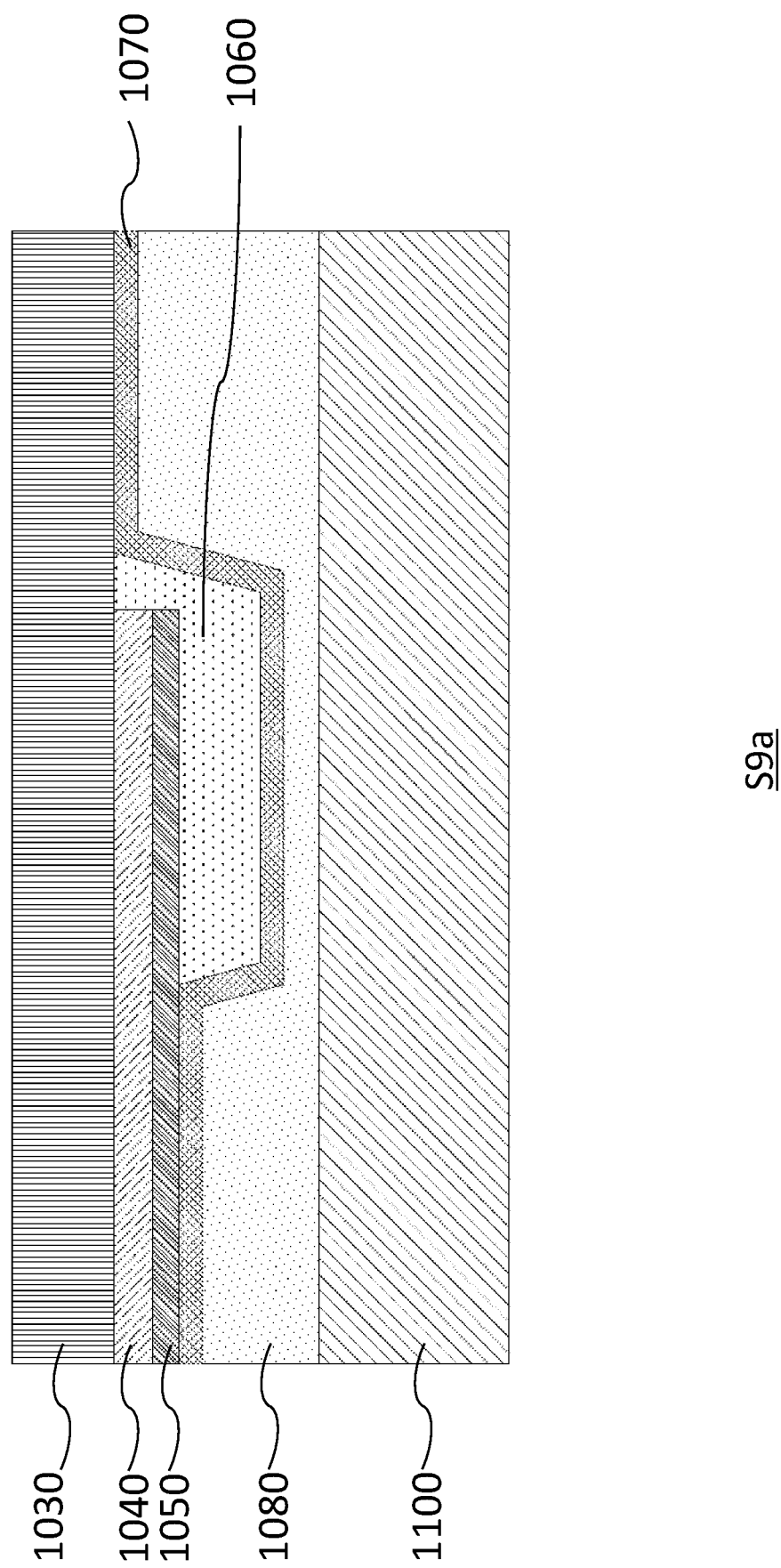

As illustrated in FIG. 28, in step S9a, piezoelectric material substrate 5000 (FIG. 27) is thinned to a certain thickness, thus obtaining piezoelectric layer 1030 with a desired thickness. The thinning process of piezoelectric material substrate 5000 may be a grinding process, a plasma dry etching process, a wet chemical etching process, a chemical mechanical polishing CMP process, or a combination thereof.

The following steps S10a through S16a in FIG. 19 are similar to steps S10 through S16 in FIG. 1, respectively. Referring to FIGS. 19 and 12-18, in step S10a, top electrode layer 1110 is deposited on piezoelectric layer 1030. In step S11a, frame layer 1120 is formed on top electrode layer 1110 and is patterned. In step S12a, top passivation layer 1130 is deposited on top electrode layer 1110 layer and frame layer 1120. In step S13a, top passivation layer 1130, frame layer 1120, and top electrode layer 1110 are patterned by etching, to form patterned top passivation layer 1130, frame layer 1120, and top electrode 1110. In step S14a, bottom electrode contact window 3010 and top electrode contact window 3020 are formed. In step S15a, bottom electrode contact layer 1140 and top electrode contact layer 1150 are formed. In step S16a, sacrificial island 1060a is etched and released to form cavity 1000a under piezoelectric layer 1030. Steps S10a through S16a are similar to steps S10 through S16, respectively, and therefore detailed descriptions of those steps are omitted.

A FBAR resonator fabricated using the LN or LT in the piezoelectric layer, according to the embodiments of the present disclosure, has a significantly larger bandwidth than a traditional FBAR resonator fabricated using aluminum nitride as the piezoelectric layer.

Figure 29:
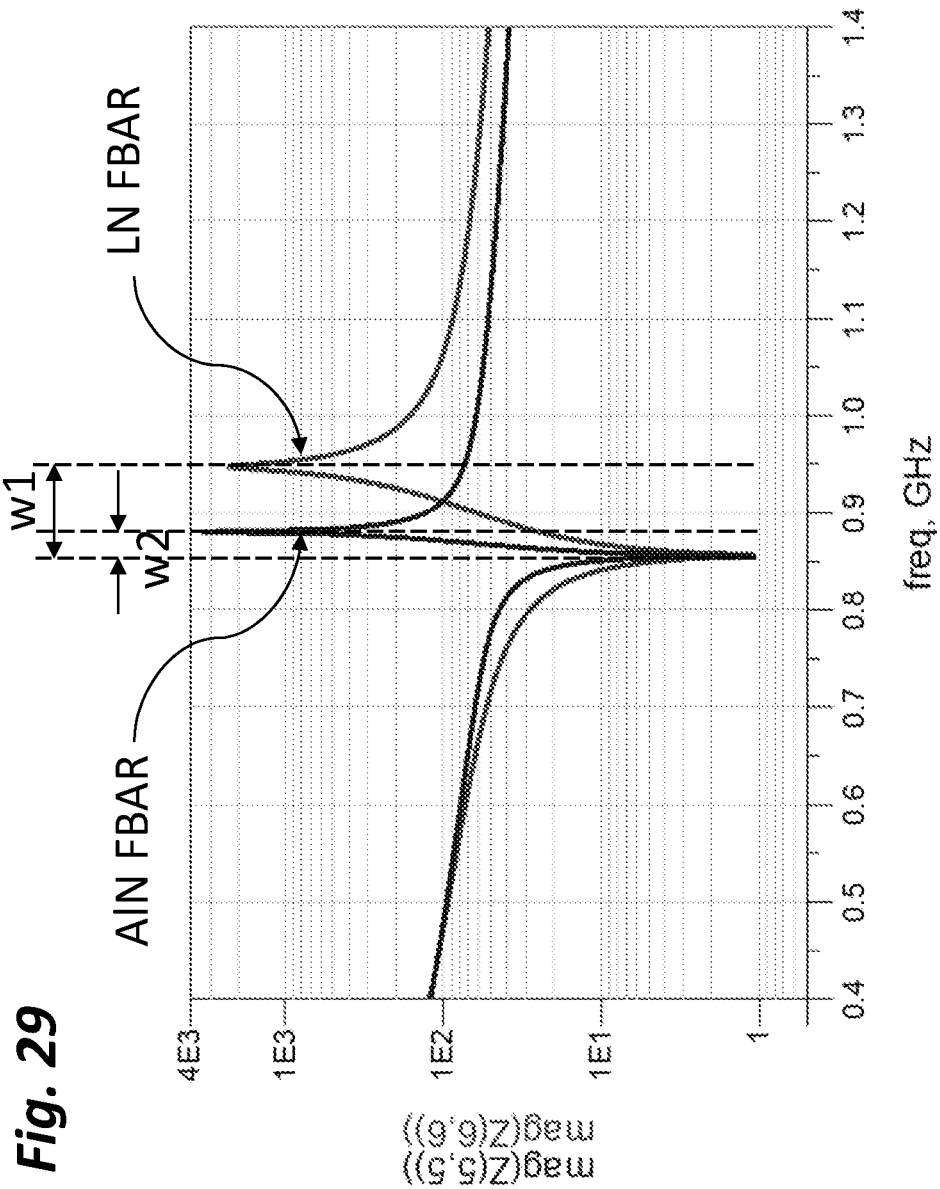
FIG. 29 is a graph showing a frequency response curve of a FBAR resonator formed with an AlN piezoelectric layer, and a frequency response curve of a FBAR resonator formed with an LN piezoelectric layer according to an embodiment of the present disclosure.

FIG. 29 is a graph showing a frequency response curve of a FBAR resonator formed with an AlN piezoelectric layer (referred to as "AlN FBAR"), and a frequency response curve of a FBAR resonator formed with an LN piezoelectric layer (referred to as "LN FBAR") according to an embodiment of the present disclosure. It can be seen from FIG. 29 that the bandwidth w1 of the LN FBAR is about 4 times of the bandwidth w2 of the AlN FBAR. Therefore, the performance of the LN FBAR is better than that of the AlN FBAR.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A film bulk acoustic resonator (FBAR) structure, comprising:
 a bottom cap wafer;
 a piezoelectric layer disposed on the bottom cap wafer, the piezoelectric layer including lithium niobate or lithium tantalate;
 a bottom electrode disposed below the piezoelectric layer;
 a top electrode disposed above the piezoelectric layer, wherein portions of the bottom electrode, the piezoelectric layer, and the top electrode that overlap with each other constitute a piezoelectric stack;
 a cavity disposed below the piezoelectric stack; and
 a boundary layer disposed below the piezoelectric layer and the cavity, and surrounding the cavity,
 wherein a projection of the piezoelectric stack is located within the cavity.

2. The FBAR structure of claim 1, further comprising:
 a raised structure disposed along an edge of the top electrode, the raised structure protruding from the top electrode in a direction away from the bottom electrode, or
 a raised structure disposed along an edge of the bottom electrode, the raised structure protruding from the bottom electrode towards the cavity.

3. The FBAR structure of claim 2, wherein the raised structure includes a conductive material.

4. The FBAR structure of claim 1, wherein the boundary layer includes a non-conductive material.

5. The FBAR structure of claim 1, further comprising:
 a bonding layer disposed below the bottom electrode,
 wherein the bottom cap wafer is bonded to the bottom bonding layer.

6. The FBAR structure of claim 5, wherein the bonding layer includes at least one of silicon oxide, silicon nitride, or ethyl silicate.

7. The FBAR structure of claim 1, further comprising:
 a top passivation layer disposed above the top electrode.

8. The FBAR structure of claim 7, wherein the top passivation layer includes an electrically insulating material.

9. The FBAR structure of claim 7, further comprising:
 a top electrode contact layer disposed above the top passivation layer and electrically connected with the top electrode via a top electrode contact window formed in the top passivation layer.

10. The FBAR structure of claim 9, wherein the top electrode contact layer includes a metal material.

11. The FBAR structure of claim 1, further comprising:
 a bottom passivation layer disposed below the bottom electrode.

12. The FBAR structure of claim 11, wherein the bottom passivation layer includes an electrically insulating material.

13. The FBAR structure of claim 11, further comprising:
 a bottom electrode contact layer disposed above the piezoelectric layer and electrically connected with the bottom electrode via a bottom electrode contact window formed in the piezoelectric layer.

14. The FBAR structure of claim 13, wherein the bottom electrode contact layer includes a metal material.

15. The FBAR structure of claim 1, wherein the bottom cap wafer comprises silicon, glass, or sapphire.

16. The FBAR structure of claim 1, wherein a vertical projection of an edge of the top electrode is located within the cavity.

17. The FBAR structure of claim 1, wherein a vertical projection of an edge of the bottom electrode is located within the cavity.

18. The FBAR structure of claim 1, wherein the top electrode and the bottom electrode include molybdenum (Mo), aluminum (Al), copper (Cu), platinum (Pt), tantalum (Ta), tungsten (W), palladium (Pd), ruthenium (Ru), or a stacked combination of two or more of those materials.

19. The FBAR structure of claim 1, wherein the cavity is formed by etching a sacrificial island formed below the piezoelectric stack.

* * * * *